US011450637B2

United States Patent
Wang et al.

(10) Patent No.: US 11,450,637 B2
(45) Date of Patent: Sep. 20, 2022

(54) METHODS FOR BONDING SEMICONDUCTOR STRUCTURES AND SEMICONDUCTOR DEVICES THEREOF

(71) Applicant: YANGTZE MEMORY TECHNOLOGIES CO., LTD., Wuhan (CN)

(72) Inventors: Di Wang, Wuhan (CN); Zhiliang Xia, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 86 days.

(21) Appl. No.: 17/020,485

(22) Filed: Sep. 14, 2020

(65) Prior Publication Data

US 2022/0020712 A1    Jan. 20, 2022

Related U.S. Application Data

(63) Continuation of application No. PCT/CN2020/102239, filed on Jul. 16, 2020.

(51) Int. Cl.
*H01L 23/48* (2006.01)
*H01L 23/52* (2006.01)
(Continued)

(52) U.S. Cl.
CPC .............. *H01L 24/08* (2013.01); *H01L 24/03* (2013.01); *H01L 24/80* (2013.01);
(Continued)

(58) Field of Classification Search
CPC combination set(s) only.
See application file for complete search history.

(56) References Cited

U.S. PATENT DOCUMENTS

2002/0063319 A1    5/2002  Huang et al.
2009/0090950 A1*   4/2009  Forbes ................... H01L 25/18
                                                438/243
(Continued)

FOREIGN PATENT DOCUMENTS

CN    109216310 A    1/2019
CN    109309074 A    2/2019
(Continued)

OTHER PUBLICATIONS

International Search Report issued in corresponding International Application No. PCT/CN2020/102239, dated Apr. 16, 2021, 5 pages.

*Primary Examiner* — Niki H Nguyen
(74) *Attorney, Agent, or Firm* — Bayes PLLC

(57) ABSTRACT

Embodiments of semiconductor devices and fabrication methods thereof are disclosed. In an example, a method for forming a semiconductor device is provided. The method includes the following operations. In a first semiconductor structure, a first bonding layer is formed having a first dielectric layer and a plurality of protruding contact structures. In a second semiconductor structure, a second bonding layer is formed having a second dielectric layer and a plurality of recess contact structures. The plurality of protruding contact structures are bonded with the plurality of recess contact structures such that each of the plurality of protruding contacts is in contact with a respective recess contact structure.

20 Claims, 15 Drawing Sheets

(51) Int. Cl.
*H01L 29/40* (2006.01)
*H01L 23/00* (2006.01)

(52) U.S. Cl.
CPC *H01L 2224/0384* (2013.01); *H01L 2224/056* (2013.01); *H01L 2224/05624* (2013.01); *H01L 2224/05647* (2013.01); *H01L 2224/05657* (2013.01); *H01L 2224/05684* (2013.01); *H01L 2224/08147* (2013.01); *H01L 2224/08148* (2013.01); *H01L 2224/80895* (2013.01); *H01L 2224/80896* (2013.01)

(56) References Cited

U.S. PATENT DOCUMENTS

| | | | |
|---|---|---|---|
| 2010/0096753 A1 | 4/2010 | Hwang et al. | |
| 2011/0278740 A1 | 11/2011 | Chen et al. | |
| 2013/0105984 A1* | 5/2013 | Rathburn | H01L 24/14 |
| | | | 257/773 |
| 2016/0197055 A1* | 7/2016 | Yu | H01L 25/50 |
| | | | 257/737 |
| 2019/0244924 A1 | 8/2019 | Zhang et al. | |

FOREIGN PATENT DOCUMENTS

| | | |
|---|---|---|
| CN | 109727848 A | 5/2019 |
| CN | 109979833 A | 7/2019 |
| CN | 110634847 A | 12/2019 |
| CN | 110876281 A | 3/2020 |
| CN | 111162041 A | 5/2020 |
| TW | 201935581 A | 9/2019 |

* cited by examiner

METHODS FOR BONDING SEMICONDUCTOR STRUCTURES AND SEMICONDUCTOR DEVICES THEREOF

CROSS-REFERENCE TO RELATED APPLICATIONS

This application is continuation of International Application No. PCT/CN2020/102239, filed on Jul. 16, 2020, entitled "METHODS FOR BONDING SEMICONDUCTOR STRUCTURES AND SEMICONDUCTOR DEVICES THEREOF," which is hereby incorporated by reference in its entirety.

BACKGROUND

Embodiments of the present disclosure relate to bonded semiconductor devices and fabrication methods thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor substrates, hybrid bonding is recognized as one of the promising techniques because of its capability of forming high-density interconnects.

SUMMARY

Embodiments of methods for bonding semiconductor structures and semiconductor devices thereof are disclosed.

In one example, embodiments of the present disclosure include a method for forming a semiconductor device. The method includes the following operations. In a first semiconductor structure, a first bonding layer is formed having a first dielectric layer and a plurality of protruding contact structures. In a second semiconductor structure, a second bonding layer is formed having a second dielectric layer and a plurality of recess contact structures. The plurality of protruding contact structures are bonded with the plurality of recess contact structures such that each of the plurality of protruding contacts is in contact with a respective recess contact structure.

In another example, embodiments of the present disclosure include a method for forming another semiconductor device. The method includes the following operations. In a first semiconductor structure, a first bonding layer is formed having a first dielectric layer, a plurality of first protruding contact structures, and a plurality of first recess contact structures. In a second semiconductor structure, a second bonding layer is formed having a second dielectric layer, a plurality of second recess contact structures, and a plurality of second protruding contact structures. The plurality of first protruding contact structures are bonded with the plurality of second recess contact structures, and the plurality of first recess contact structures are bonded with the plurality of second protruding contact structures. Each of the plurality of first protruding contacts is in contact with a respective second recess contact structure and each of the plurality of first recess contact structures is in contact with a respective second protruding contact structure.

In still another example, embodiments of the present disclosure provide a semiconductor device having a first semiconductor structure and a second semiconductor structure. The first semiconductor structure includes a first bonding layer having a first dielectric layer and a first portion of a contact structure in the first dielectric layer. The second semiconductor structure includes a second bonding layer having a second dielectric layer and a second portion of the contact structure in the second dielectric layer. The semiconductor device also includes a bonding interface between the first semiconductor structure and the second semiconductor structure. The first and second portions of the contact structure are in contact with each other. A first portion of the bonding interface extends outside the contact structure and between the first and second dielectric layers. A second portion of the bonding interface extends inside the contact structure and is non-coplanar with the first portion of the bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
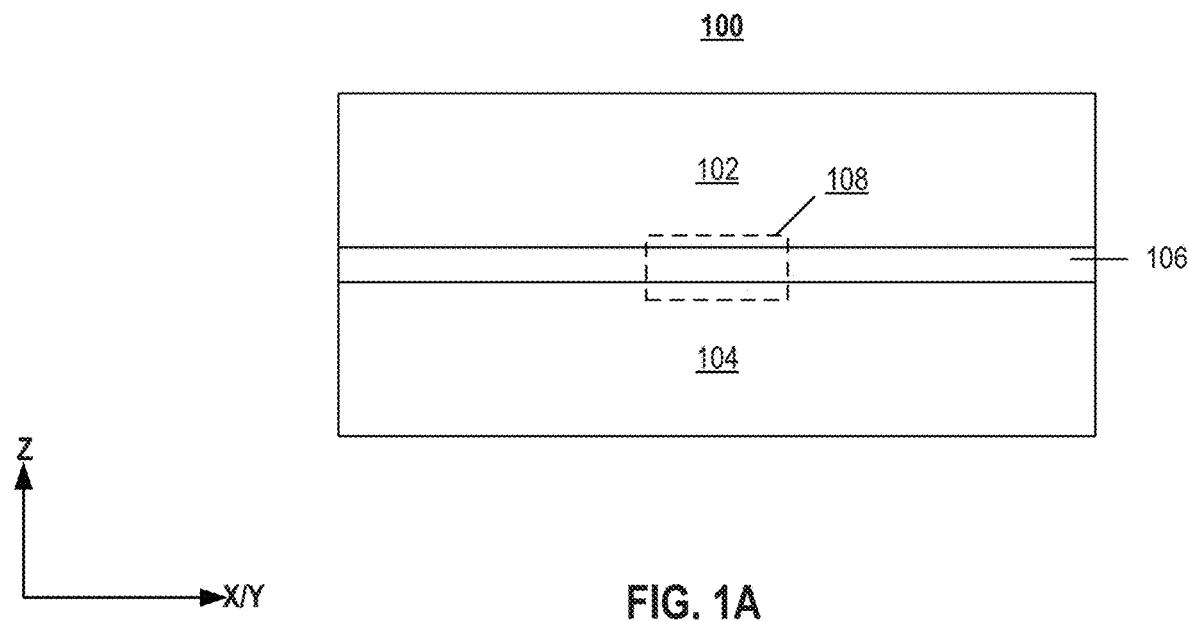
FIG. 1A illustrates a schematic view of a cross-section of an exemplary semiconductor device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, the term "top surface" refers to the surface of a structure that is the farthest away from the substrate the structure is formed on/in, and the term "bottom surface" refers to the surface of a structure that is the closest to the substrate the structure is formed on/in. In the present disclosure, the relative positions of the top surface and the bottom surface do not change as the orientation of the object changes.

In the present disclosure, the elevation of a surface of an object is defined as the distance between the surface and the substrate on/in which the object is formed. In the present disclosure, the relative position of the two surfaces is defined based on the elevations of the two surfaces and does not change as the orientation of the objects change.

As 3D NAND memory devices continue to scale up vertically (e.g., having 96-layers or more), it may not be feasible to enable one-step etching of high aspect ratio structures, such as channel holes and gate line slits (GLSs), due to dry etching challenges. Especially, for small-size patterns like channel holes, critical dimension (CD) control and further reduction would benefit cell density increase.

Direct bonding technologies have been proposed to fabricate some 3D NAND memory devices (e.g., having 96-layers or more) by joining peripheral device and memory array on different substrates. However, direct bonding processes may have limitations such as not sufficient bonding strength due to various reasons such as flat surface contact, wafer warpage, and/or stress.

Various embodiments in accordance with the present disclosure provide semiconductor devices, e.g., 3D NAND memory devices, formed by the joining of a pair of semiconductor structures with a plurality of contact structures. One of the semiconductors may include a plurality of logic process-compatible devices conductively connected to the contact structures, and the other one of the semiconductor structures structures may include an array of NAND memory cells conductively connected to the contact structures. The contact structures, e.g., a metal material, are formed by the bonding of two bonding layers. The bonding interface between the bonding layers may include a first portion outside the contact structures and a second portion in the contact structures. The second portion of the bonding interface may not be coplanar with the first portion. In some embodiments, the second portion of the bonding interface may include curved or angled contours/boundaries. The lateral dimensions of the top and bottom surfaces of each contact structure are different.

Different from conventional bonding contacts, the contact structures of the present disclosure are each be formed by the bonding of a protruding contact structure and a recess contact structure. The protruding contact structure and the recess contact structure may be in contact with each other laterally and vertically, increasing the contact area, compared to conventional flat-surface contact. The bonding process may cause friction and diffusion of atoms between the protruding and recess contact structures, increasing the bonding strength at the bonding interface. Specifically, the friction between the side surfaces of the protruding and recess contact structures can provide additional lateral bonding strength compared to conventional flat-surface bonding.

In the present disclosure, a protruding contact structure can be formed in the respective semiconductor structure and has a top surface above (e.g., higher than) the top surface of the respective dielectric layer. A recess contact structure, matching the protruding contact structure, can be formed on the respective semiconductor structure and has a top surface below (e.g., lower than) the top surface of the respective dielectric layer. The shapes and dimensions of the protruding contact structure and the recess contact structure can be designed and fabricated to result in optimized bonding strength between the semiconductor structures. The bonding strength between the semiconductor structures can thus be improved.

FIG. 1A illustrates a schematic view of a cross-section of an exemplary semiconductor device 100, according to some embodiments. Semiconductor device 100 represents an example of a semiconductor device formed by the bonding of a pair of semiconductor structures 102 and 104. The components of semiconductor device 100 (e.g., logic process-compatible devices and NAND memory) can be formed separately on different wafers and then joined to form a bonded chip/device. As shown in FIG. 1A, semiconductor structures 102 and 104 may be bonded by a bonding structure 106. Data/electric signals may transfer between semiconductor structures 102 and 104 through bonding structure 106. As an example, semiconductor structure 102 includes a plurality of logic process-compatible devices, and semiconductor structure 104 includes an array of NAND memory cells.

In some embodiments, the logic process-compatible devices in semiconductor structure 102 include any semiconductor device that can be fabricated in a way that is comparable to the fabrication processes for logic devices. For example, the logic process-compatible devices may include peripheral circuits of memory devices. In some embodiments, the logic process-compatible devices also include processors, controllers, random-access memory (RAM) (e.g., dynamic RAM (DRAM) and/or or static (SRAM)). In some embodiments, the logic process-compatible devices include a processor, an array of RAM cells, and a peripheral circuit for an array of NAND memory cells (e.g., included in semiconductor structure 104). In some embodiments, the logic process-compatible devices are formed using complementary metal-oxide-semiconductor (CMOS) technology. Both the processor and the array of RAM cells, if any, can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed. The processor can include any suitable general or specialized processors. The controllers can include any suitable software and/or hardware that handle specific operations of the semiconductor device 100. The RAM may include suitable DRAM and/or SRAM.

In some embodiments, semiconductor structure 102 of semiconductor device 100 further includes the entirety or part of the peripheral circuits of the NAND memory of semiconductor structure 104. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

Semiconductor structure 104 may include an array of NAND memory cells. That is, semiconductor structure 104 can be a NAND flash memory device in which memory cells are provided in the form of an array of 3D NAND memory strings and/or an array of two-dimensional (2D) NAND memory cells. NAND memory cells can be organized into pages which are then organized into blocks in which each NAND memory cell is electrically connected to a separate line called a bit line (BL). All cells with the same vertical position in the NAND memory cell can be electrically connected through the control gates by a word line (WL). In some embodiments, a plane contains a certain number of blocks that are electrically connected through the same bit line. Semiconductor structure 104 can include one or more planes, and the peripheral circuits that are needed to perform all the read/write/erase operations can be included in semiconductor structures 102 and/or 104. In some embodiments, the array of NAND memory cells are an array of 2D NAND memory cells, each of which includes a floating-gate transistor. The array of 2D NAND memory cells include a plurality of 2D NAND memory strings, each of which includes a plurality of memory cells (e.g., 32 to 128 memory cells) connected in series (resembling a NAND gate) and two select transistors, according to some embodiments. In some embodiments, the array of NAND memory cells are an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

Figure 1B:
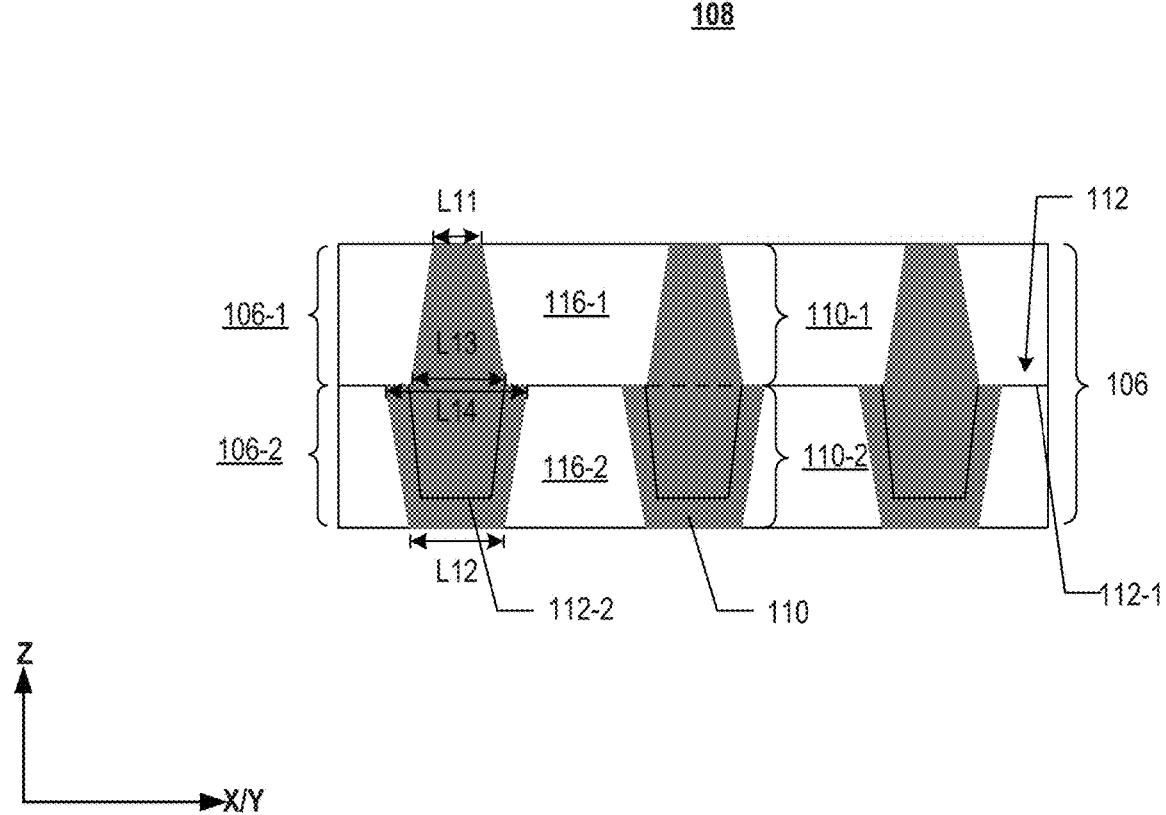
FIGS. 1B, 1C, and 1D each illustrates a cross-sectional view of a partial bonding structure in the exemplary semiconductor device, according to some embodiments.
Figure 1C:
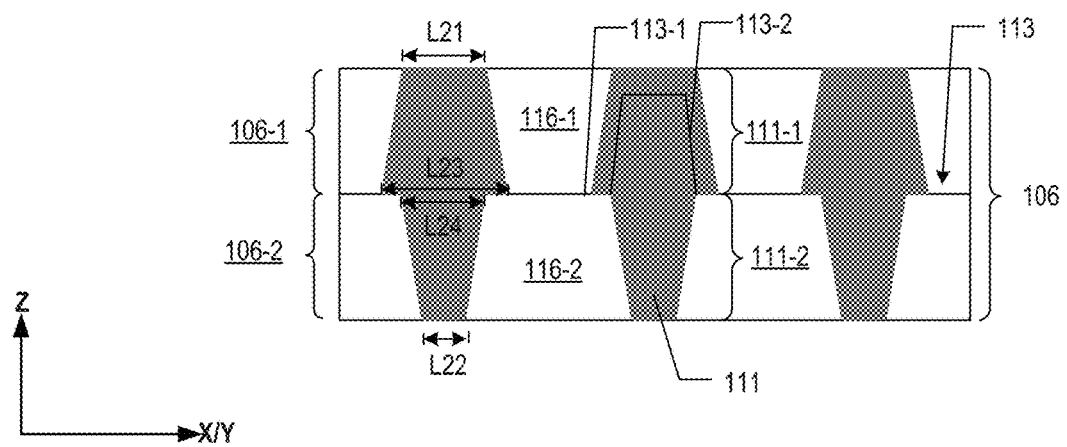
Figure 1D:
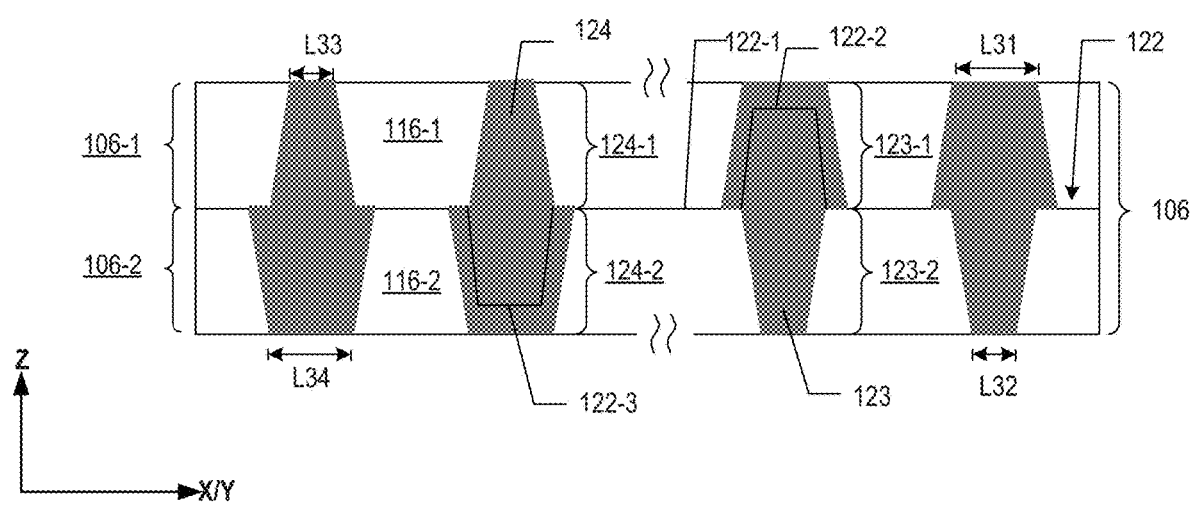

As shown in FIG. 1A, semiconductor device 100 may include bonding structure 106, conductively connected to semiconductor structures 102 and 104. Detailed structures of a portion 108 of bonding structure 106 are shown in FIGS. 1B-1D. In one example as shown in FIG. 1B, bonding structure 106 may be formed by the bonding of a first bonding layer 106-1 and a second bonding layer 106-2. First bonding layer 106-1, including a first dielectric layer 116-1, may be a part of semiconductor structure 102. Second bonding layer 106-2, including a second dielectric layer 116-2, may be a part of semiconductor structure 104. Bonding structure 106 may include a bonding interface 112, at which first and second bonding layers 106-1 are bonded. A plurality of contact structures 110 may be disposed in bonding structure 106 (e.g., in first and second dielectric layers 116-1 and 116-2), conductively connected to respective parts in semiconductor structures 102 and 104. Bonding interface 112 may include a first interface portion 112-1 outside contact structures 110 and a second interface portion 112-2 inside contact structures 110. In some embodiments, along the z-direction, each of first and second dielectric layers 116-1 and 116-2 has a thickness in a range of about 150 nm to about 300 nm (e.g., 150 nm, 180 nm, 200 nm, 250 nm, 280 nm, 300 nm, 320 nm, 350 nm). In some embodiments, the thickness of each of first and second dielectric layers 116-1 and 116-2 is about 200 nm.

First interface portion 112-1 may include the area where first and second dielectric layers 116-1 and 116-2 are bonded to be in contact with each other. Second interface portion 112-2 may include the contact area where portions of contact structure 110 are bonded to be in contact with each other. As will be described in detail below, each contact structure 110 may be formed by the bonding of a protruding contact structure and a recess contact structure. Because the contact area of protruding contact structure and the recess contact structure each includes surfaces with angles, these surfaces with angles cause second interface portion 112-2 to deviate from the plane of first interface portion 112-1. The contact area between the protruding contact structure and the recess contact structure are thus not coplanar with the first interface portion 112-1. That is, second interface portion 112-2 may not be coplanar with first interface portion 112-1.

As an example, as shown in FIG. 1B, the protruding contact structures may be a part of first bonding layer 106-1, and the recess contact structures may be a part of second bonding layer 106-2. Along the z-direction, second interface portion 112-2 may extend below first interface portion 112-1. In some embodiments, second interface portion 112-2 generally follows the contour of the contact area between the protruding contact structure and the recess contact structure. In some embodiments, second interface portion 112-2 deviates from the original contour (e.g., before bonding) of the contact area between the protruding contact structure and the recess contact structure because of, e.g., deformation and/or atom diffusion, the bonding process. In some embodiments, the bonding process causes the protruding contact structure and the recess contact structure to merge such that parts of second interface portion 112-2 become indistinguishable from the surrounding materials. It should be noted that, the outline of bonding interface depicted in the present disclosure (e.g., 112 is merely for the purpose of illustrating the relative position between second interface portion 112-2 and first interface portion 112-1, and does not represent the actual contour of bonding interface 112.

For ease of illustration, the portion of contact structure 110 in first dielectric layer 116-1 and above the plane (shown as the dashed line in FIG. 1B) coplanar with first interface portion 112-1 is referred to as a first contact portion 110-1; and the portion of contact structure 110 in second dielectric layer 116-2 and below the plane is referred to as a second contact portion 110-2. Contact structure 110 may be regarded as first and second contact portions 110-1 and 110-2 being in contact with each other in the plane. As an example, as shown in FIG. 1B, second interface portion 112-2 may be located in second contact portions 110-2, instead of between the first and second contact portions in the conventional bonding process.

The cross-section of first contact portion 110-1 may have a trapezoid shape, and the cross-section of second contact portion 110-2 may have an inverted trapezoid shape. The lateral dimensions of each of first and second contact portions 110-1 and 110-2 may gradually increase towards the plane. As shown in FIG. 1B, a lateral dimension L11 (e.g., along the x-direction or the y-direction) of the top surface of first contact portion 110-1 may be less than a lateral dimension L13 of the bottom surface of first contact portion 110-1, and a lateral dimension L14 of the top surface of second contact portion 110-2 may be greater than a lateral dimension L12 of the bottom surface of second contact portion 110-2. In some embodiments, lateral dimensions L11 and L13 may each be in the range of about 200 nm to about 350 nm (e.g., 200 nm, 250 nm, 280 nm, 300 nm, 320 nm, 350 nm). In some embodiments, lateral dimensions L14 and L12 may each be in the range of about 300 nm to about 450 nm (e.g., 300 nm, 350 nm, 380 nm, 400 nm, 420 nm, 450 nm). In some embodiments, lateral dimension L11 is less than lateral dimension L12. In some embodiments, lateral dimension L13 is less than lateral dimension L14, with L13 being less than 300 nm and L14 being about 400 nm.

FIG. 1C illustrates another example of bonding structure 106, according to some embodiments. Bonding structure 106 may include a bonding interface 113 at which first and second bonding layers 106-1 and 106-2 are bonded to be in contact with each other. Bonding structure 106 may include a plurality of contact structures 111, each of which includes a first contact portion 111-1 in first dielectric layer 116-1 and a second contact portion 111-2 in second dielectric layer 116-2. A lateral dimension L21 (e.g., along the x-direction or the y-direction) of the top surface of first contact portion 111-1 may be less than a lateral dimension L23 of the bottom surface of first contact portion 111-1, and a lateral dimension L24 of the top surface of second contact portion 111-2 may be greater than a lateral dimension L22 of the bottom surface of second contact portion 111-2. In some embodiments, lateral dimensions L21 and L23 may each be in the range of about 300 nm to about 450 nm (e.g., 300 nm, 350 nm, 380 nm, 400 nm, 420 nm, 450 nm). In some embodiments, lateral dimensions L24 and L22 may each be in the range of about 200 nm to about 350 nm (e.g., 200 nm, 250 nm, 280 nm, 300 nm, 320 nm, 350 nm). Different from bonding structure 106 shown in FIG. 1B, lateral dimension L21 is greater than lateral dimension L22. In some embodiments, lateral dimension L23 is greater than lateral dimension L24, with L23 being about 400 nm and L24 being less than 300 nm.

Also, as shown in FIG. 1C, bonding interface 113 may include a first interface portion 113-1 and a second interface portion 113-2. In some embodiments, first interface portion 113-1 represents the area/surfaces that first and second dielectric layers 116-1 and 116-2 are bonded to be in contact with each other, and second interface portion 113-2 represents the area/surfaces the protruding contact structures, and the recess contact structures are bonded to be in contact with each other. Different from bonding interface 112 in FIG. 1B, the protruding contact structures may be a part of second bonding layer 106-2, and the recess contact structures may be a part of first bonding layer 106-1. Second interface portion 113-2 may be above first interface portion 113-1 and may be located in first contact portions 111-1.

FIG. 1D illustrates another example of bonding structure 106, according to some embodiments. Bonding structure 106 may include a bonding interface 122 at which first and second bonding layers 106-1 and 106-2 are bonded to be in contact with each other. Different from bonding structures 106 shown in FIGS. 1B and 1C, in FIG. 1D, bonding structure 106 may include a plurality of contact structures 123 and 124. Each contact structure 123 includes a first contact portion 123-1 in first dielectric layer 116-1 and a second contact portion 123-2 in second dielectric layer 116-2. Each contact structure 124 includes a first contact portion 124-1 in first dielectric layer 116-1 and a second contact portion 124-2 in second dielectric layer 116-2. In some embodiments, contact structure 123 is similar to contact structure 111, and contact structure 124 is similar to contact structure 110. For example, a lateral dimension L31 of the top surface of first contact portion 123-1 may be greater than lateral dimension L32 of the bottom surface of second contact portion 123-2, and a lateral dimension L33 of the top surface of first contact portion 124-1 may be less than lateral dimension L34 of the bottom surface of second contact portion 124-2. The structures and materials of contact structures 123 and 124 may be similar to those of contact structures 111 and 110, respectively, and the detailed descriptions are not repeated herein. Contact structures 123 and 124 can be formed in any suitable locations in bonding structure 106, depending on the design and fabrication process.

Different from bonding structures 106 shown in FIGS. 1B and 1C, in FIG. 1D, bonding structure 106 may be formed by a first bonding layer 106-1 having a plurality of first protruding contact structures and a plurality of first recess contact structures bonded to a second bonding layer 106-2 having a plurality of second recess contact structures and a plurality of second protruding contact structures. Each first protruding contact structure may be bonded to be in contact with a respective (e.g., matching) second recess contact structure, and each first recess contact structure may be bonded to be in contact with a respective second protruding contact structure. As shown in FIG. 1D, bonding interface 122 may include a first interface portion 122-1, a second interface portion 122-2, and a third interface portion 122-3. In some embodiments, first interface portion 122-1 represents the area/surfaces that first and second dielectric layers 116-1 and 116-2 are bonded to be in contact with each, second interface portion 122-2 represents the area/surfaces the first recess contact structures and second protruding contact structures are bonded to be in contact with each other, and third interface portion 122-3 represents the area/surfaces the first protruding contact structures and second recess contact structures are bonded to be in contact with each other. Second interface portion 122-2 and third interface portion 122-3 each may not be coplanar with first interface portion 122-1. In some embodiments, second interface portion 122-2 may be above first interface portion 122-1 and may be located in first contact portions 123-1. In some embodiments, third interface portion 122-3 may be below first interface portion 122-1 and may be located in second contact portions 123-2.

Contact structures shown in FIGS. 1B-1D (e.g., 110, 111, 123, and 124) may each include any suitable conductive material(s) such as copper, tungsten, aluminum, cobalt, polysilicon, doped silicon, and/or silicides. In some embodiments, the contact structures may include a metal material such as copper. Each protruding contact structure and the respective recess contact structure may include the same material(s). First and second dielectric layers 116-1 and 116-2 may each include suitable dielectric material(s) such as silicon oxide, silicon nitride, and/or silicon oxynitride.

The bonding between first and second bonding layers 106-1 and 106-2, in each bonding structure 106 shown in FIGS. 1B-1D, may include a suitable bonding method, such as hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding may be formed between each protruding contact structure and the respective recess contact structure, and the dielectric-dielectric bonding may be formed between first and second dielectric layers 116-1 and 116-2.

It is understood that the relative positions and the number of stacked semiconductor structures are not limited in the present disclosure. In some embodiments, the array of NAND memory cells are above the logic process-compatible devices along the z-direction. In some embodiments, the array of NAND memory cells are below the logic process-compatible devices, along the z-direction. At least two semiconductor structures can be bonded with the bonding structures (or bonding layers) illustrated in FIGS. 1B-1D. Data transfer between the NAND memory and the logic process-compatible devices (e.g., processors and RAM) can be performed through the contact structures across bonding structure 106.

Figure 2:
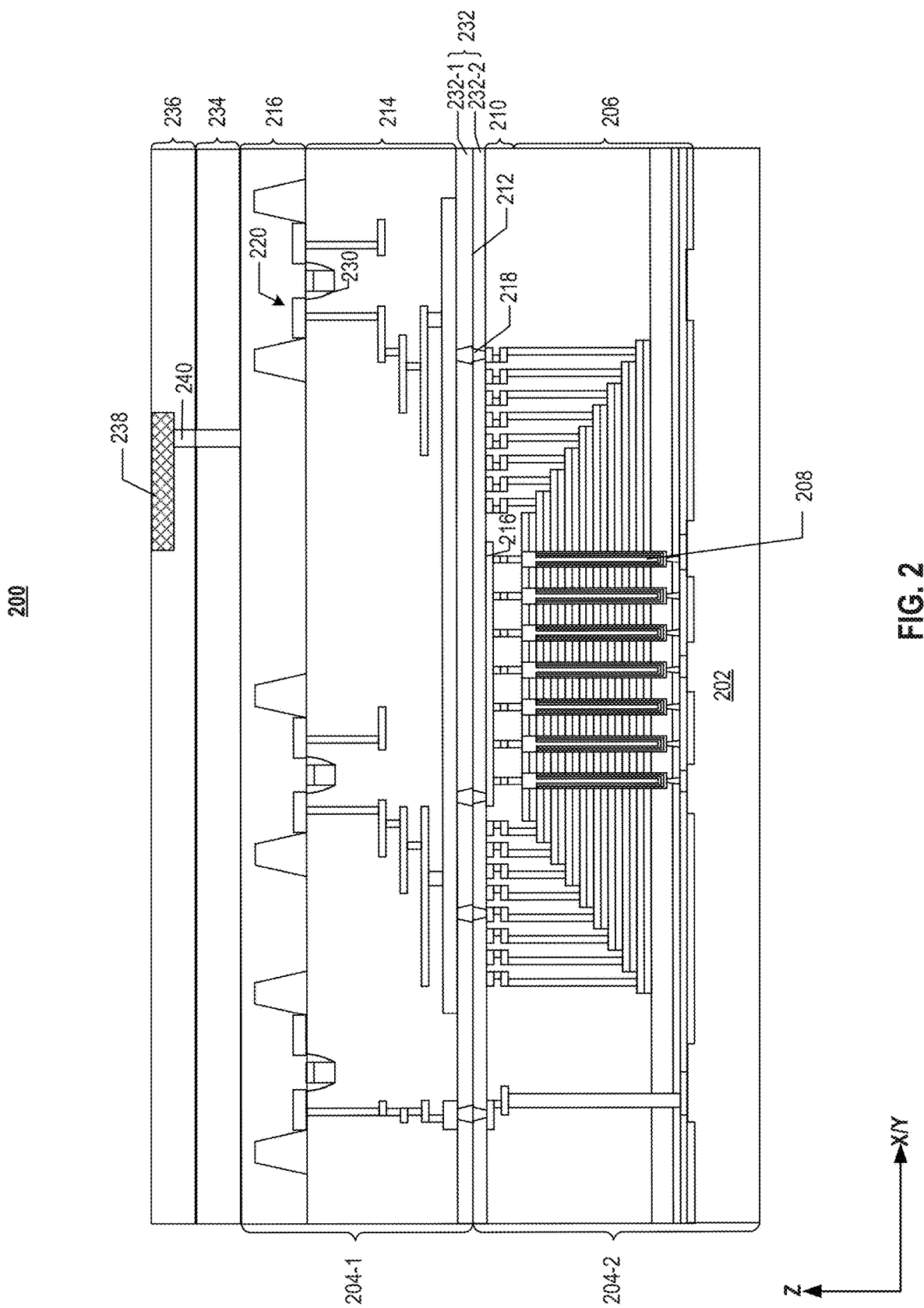
FIG. 2 illustrates a detailed schematic view of a cross-section of an exemplary semiconductor device, according to some embodiments.

FIG. 2 illustrates a semiconductor device 200 having a pair of semiconductor structures bonded with a bonding structure, according to some embodiments. The bonding structure may be similar to or the same as any one of bonding structure 106 illustrated in FIGS. 1B-1D. As an example, in semiconductor device 200, the logic process-compatible devices are positioned above the array of NAND memory cells along the z-direction. It should be noted that the embodiments of the present disclosure are described in view of two semiconductor structures, for the ease of illustration. In many other embodiments, more than two semiconductor structures may be stacked vertically using more than one bonding structure. The types, and/or positions/layout of contact structures in each bonding structure may be the same or similar, depending on the design and/or the bonding contacts on the semiconductor structures. It should also be noted that, throughout the present disclosure, the structures of semiconductor devices and the conductive connections in the semiconductor devices depicted in the figures are for illustrative purposes only and are not meant to represent the actual structures or conductive connections of the semiconductor devices.

As shown in FIG. 2, semiconductor device 200 includes a bonded chip including a second semiconductor structure 204-2 and a first semiconductor structure 204-1 stacked over second semiconductor structure 204-2. First and second semiconductor structures 204-1 and 204-2 are joined by a bonding structure 232 therebetween, which may be formed by the bonding of a first bonding layer 232-1 in first semiconductor structure 204-1 and a second bonding layer 232-2 in second semiconductor structure 204-2. As shown in FIG. 2, second semiconductor structure 204-2 can include a substrate 202, which can include silicon (e.g., single crystalline silicon, c-Si), silicon germanium (SiGe), gallium arsenide (GaAs), germanium (Ge), silicon on insulator (SOI), or any other suitable materials.

Second semiconductor structure 204-2 of semiconductor device 200 can include a memory stack 206 above substrate 202. It is noted that z- and x/y-directions are added in FIG. 2 to further illustrate the spatial relationship of the components in semiconductor device 200. Substrate 202 includes two lateral surfaces (e.g., a top surface and a bottom surface) extending laterally in the x- and y-directions (the lateral direction or width direction). As used herein, whether one component (e.g., a layer or a device) is "on," "above," or "below" another component (e.g., a layer or a device) of a semiconductor device (e.g., semiconductor device 200) is determined relative to the substrate of the semiconductor device (e.g., substrate 202) in the z-direction (the vertical direction or thickness direction) when the substrate is positioned in the lowest plane of the semiconductor device in the z-direction. The same notion for describing the spatial relationship is applied throughout the present disclosure.

In some embodiments, second semiconductor structure 204-2 includes a NAND Flash memory device in which memory cells are provided in the form of an array of 3D NAND memory strings 208. Each 3D NAND memory string 208 extends vertically through a plurality of pairs each including a conductor layer and a dielectric layer, according to some embodiments. The stacked and interleaved conductor layers and dielectric layer are also referred to herein as a memory stack 206. The interleaved conductor layers and dielectric layers in memory stack 206 alternate in the vertical direction, according to some embodiments. In other words, except for the ones at the top or bottom of memory stack 206, each conductor layer can be adjoined by two dielectric layers on both sides, and each dielectric layer can be adjoined by two conductor layers on both sides. The conductor layers can each have the same thickness or different thicknesses. Similarly, the dielectric layers can each have the same thickness or different thicknesses. The conductor layers can include conductor materials including, but not limited to, W, Co, Cu, Al, doped silicon, silicides, or any combination thereof. The dielectric layers can include dielectric materials including, but not limited to, silicon oxide, silicon nitride, silicon oxynitride, or any combination thereof.

In some embodiments, each 3D NAND memory string 208 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string 208 can have a cylinder shape (e.g., a pillar shape). The semiconductor channel, the tunneling layer, the storage layer, and the blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide (HfO2) or tantalum oxide ($Ta_2O_5$) layer, and so on.

In some embodiments, the 3D NAND memory strings further include a plurality of control gates (each being part of a word line). Each conductor layer in memory stack 206 can act as a control gate for each memory cell of the 3D NAND memory string 208. In some embodiments, each 3D NAND memory string 208 includes two plugs at a respective end in the z-direction. As used herein, the "upper end" of a component (e.g., 3D NAND memory string 208) is the end farther away from substrate 202 in the z-direction, and the "lower end" of the component (e.g., 3D NAND memory string 208) is the end closer to substrate 202 in the z-direction when substrate 202 is positioned in the lowest plane of semiconductor device 200. The plug at the lower end can be in contact with semiconductor channel and include a semiconductor material, such as single-crystal silicon, that is epitaxially grown from substrate 202. The plug at the lower end can function as the channel controlled by a source select gate of the 3D NAND memory string 208. The plug at the upper end can include semiconductor materials (e.g., polysilicon). By covering the upper end of 3D NAND memory string 208 during the fabrication of second semiconductor structure 204-2, the plug at the upper end can function as an etch stop layer to prevent etching of dielectrics filled in 3D NAND memory string 208, such as silicon oxide and silicon nitride. In some embodiments, the plug at the upper end functions as the drain of 3D NAND memory string 208.

It is understood that 3D NAND memory strings 208 are not limited to the "charge trap" type of 3D NAND memory strings and may be "floating gate" type of 3D NAND memory strings in other embodiments. Substrate 202 may include polysilicon as the source plate of the "floating gate" type of 3D NAND memory strings.

In some embodiments, second semiconductor structure 204-2 further includes an interconnect layer 210 above memory stack 206 to transfer electrical signals. Interconnect layer 210 can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. In some embodiments, the interconnects in interconnect layer 210 also include local interconnects, such as bit line contacts conductively connected to 3D NAND memory strings 208 and word line contacts conductively connected to the conductor layers of memory stack 206. Interconnect layer 210 can further include one or more interlayer dielectric (ILD) layers (also known as "intermetal dielectric (IMD) layers") in which the interconnect lines and VIA contacts can form. The interconnect lines and via contacts in interconnect layer 210 can include conductive materials including, but not limited to, W, Co, Cu, Al, silicides, or any combination thereof. ILD layers in interconnect layer 210 can include dielectric materials including, but not limited to, silicon oxide, silicon nitride, silicon oxynitride, low-k dielectrics, or any combination thereof.

In some embodiments, first semiconductor structure 204-1 of semiconductor device 200 includes a device layer 216 which includes a peripheral circuit 220. For example, peripheral circuit 220 may be part or the entirety of the peripheral circuits for controlling and sensing the NAND memory of semiconductor device 200. In some embodiments, transistors 230 further form peripheral circuit 220, i.e., any suitable digital, analog, and/or mixed-signal control and sensing circuits used for facilitating the operation of the NAND memory including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, device layer 216 further includes a processor and/or an array of RAM cells outside of peripheral circuit 220.

In some embodiments, first semiconductor structure 204-1 includes an interconnect layer 214 under and in contact with device layer 216 to transfer electrical signals to and from peripheral circuit 220. Interconnect layer 214 can include a plurality of interconnects, including lateral interconnect lines and VIA contacts, such as MEOL interconnects and BEOL interconnects. Interconnect layer 214 can further include one or more ILD layers in which the interconnect lines and via contacts can form. That is, interconnect layer 214 can include interconnect lines and VIA contacts in multiple ILD layers. The interconnect lines and via contacts in interconnect layer 214 can include conductive materials including, but not limited to, tungsten (W), cobalt (Co), copper (Cu), aluminum (Al), silicides, or any combination thereof. The ILD layers in interconnect layer 214 can include dielectric materials including, but not limited to, silicon oxide, silicon nitride, silicon oxynitride, low dielectric constant (low-k) dielectrics, or any combination thereof. In some embodiments, the devices in device layer 216 are electrically connected to one another through the interconnects in interconnect layer 214. For example, the array of RAM cells may be electrically connected to the processor through interconnect layer 214.

In some embodiments, first semiconductor structure 204-1 includes a semiconductor layer 234 above and in contact with device layer 216. Semiconductor layer 234 can be a thinned substrate on which device layer 216 (e.g., transistors 230) is formed. In some embodiments, semiconductor layer 234 includes single-crystal silicon. In some embodiments, semiconductor layer 234 can include polysilicon, amorphous silicon, SiGe, GaAs, Ge, or any other suitable materials. Semiconductor layer 234 can also include isolation regions and doped regions.

Transistors 230 can be formed "on" semiconductor layer 234, in which the entirety or part of transistors 230 are formed in semiconductor layer 234 (e.g., above the bottom surface of semiconductor layer 234) and/or directly on semiconductor layer 234. Isolation regions (e.g., shallow trench isolations (STIs)) and doped regions (e.g., source regions and drain regions of transistors 230) can be formed in semiconductor layer 234 as well. Transistors 230 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

First semiconductor structure 204-1 can further include a pad-out interconnect layer 236 above semiconductor layer 234. Pad-out interconnect layer 236 can include interconnects, e.g., contact pads 238, in one or more ILD layers. In some embodiments, the interconnects in pad-out interconnect layer 236 can transfer electrical signals between semiconductor device 200 and outside circuits, e.g., for pad-out purposes. Pad-out interconnect layer 236 and interconnect layer 214 can be formed at opposite sides of semiconductor layer 234.

In some embodiments, first semiconductor structure 204-1 further includes one or more contacts 240 extending through semiconductor layer 234 to electrically connect pad-out interconnect layer 236 and interconnect layers 214 and 210. As a result, peripheral circuit 220 can be electrically connected to array of 3D NAND memory strings 208 through interconnect layers 214 and 210 as well as bonding structure 232. Moreover, peripheral circuit 220 (and processor and/or RAM cells, if any) and array of 3D NAND memory strings 208 can be electrically connected to outside circuits through contact structures 218 and pad-out interconnect layer 236.

As shown in FIG. 2, first semiconductor structure 204-1 may include a first bonding layer 232-1, and second semiconductor structure 204-2 may further include a second bonding layer 232-2. First and second bonding layers 232-1 and 232-2 may be bonded at a bonding interface 212, forming bonding structure 232. Along the z-direction, first bonding layer 232-1 may be below interconnect layer 214 and above bonding interface 212, and second bonding layer 232-2 may be above interconnect layer 210 and below bonding interface 212. First bonding layers 232-1 may be in contact with and conductively connected to interconnect layer 214, and second bonding layers 232-2 may be in contact with and conductively connected to interconnect layer 210. Semiconductor device 200 may include a plurality of contact structures 218 (e.g., bonding contacts) disposed in bonding structure 232, conductively connected to interconnect layers 210 and 214 such that device layer 216 can be conductively connected to memory stack 206 (or 3D NAND memory strings 208). Along the z-direction, contact structures 218 may extend across bonding interface 212 to transmit electrical signals between interconnect layers 210 and 214. Contact structures 218 may be disposed at any suitable locations in bonding structure 232 to provide conductive connections between first and second semiconductor structures 204-1 and 204-2. For example, contact structures 218 may be in contact with and conductively connected to interconnects that are conductively connected to 3D NAND memory strings 208 and the conductor layers in memory stack 206.

Bonding structure 232, formed by the bonding of first and second bonding layers 232-1 and 232-2, may include contact structures 218 and dielectrics electrically insulating contact structures 218. Contact structures 218 can include conductive materials including, but not limited to, W, Co, Cu, Al, silicides, or any combination thereof. In some embodiments, contact structures 218 includes Cu. The remaining area of first and second bonding layers 232-1 and 232-2 can be formed with dielectrics including, but not limited to, silicon oxide, silicon nitride, silicon oxynitride, low-k dielectrics, or any combination thereof. Bonding structures 232 may be similar to any one of bonding structures 106 illustrated in FIGS. 1B-1D. The structures and compositions of bonding structure 232, e.g., contact structures 218, bonding interface 242, and first and second bonding layers 232-1 and 232-2, may be similar to those of bonding structures 106 illustrated in FIGS. 1B-1D, and the detailed descriptions are not repeated herein.

Figure 3B:
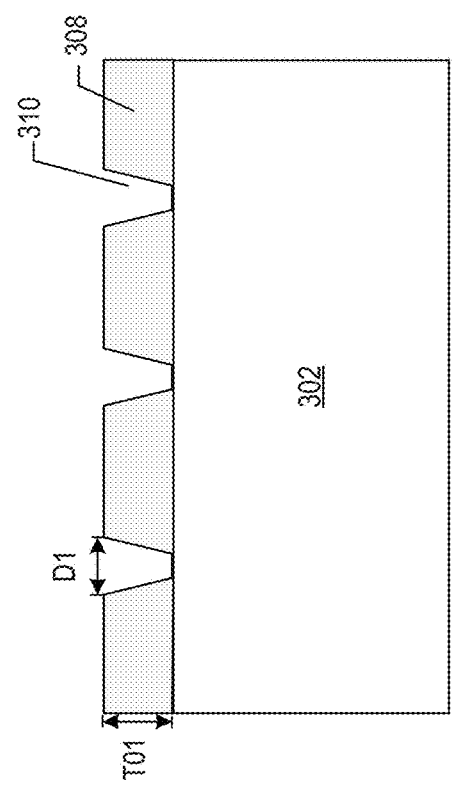
FIGS. 3A-3E illustrate an exemplary fabrication process for forming a semiconductor structure in the semiconductor device in FIG. 2, according to some embodiments.
Figure 3B:
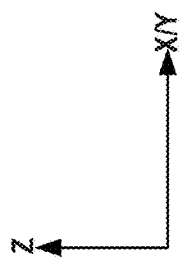
Figure 3A:
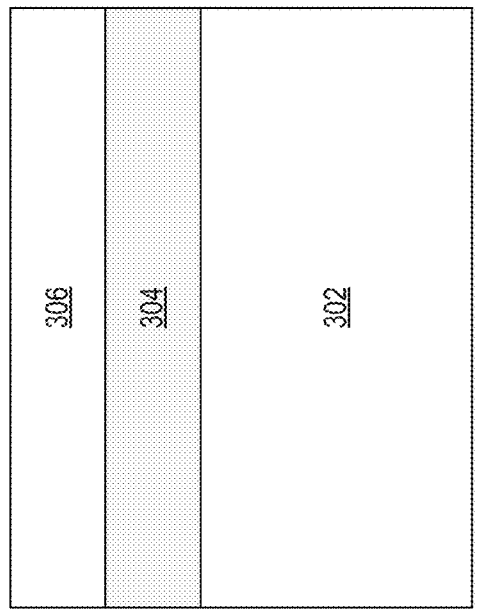
Figure 3A:
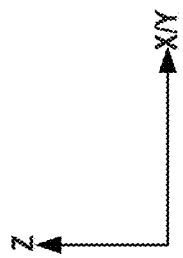
Figure 3D:
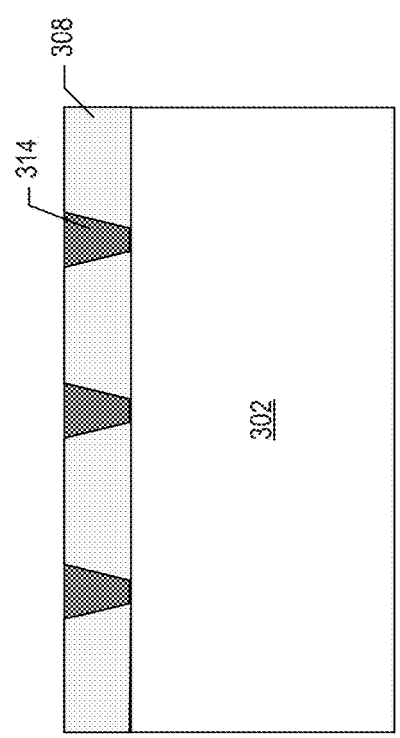
Figure 3C:
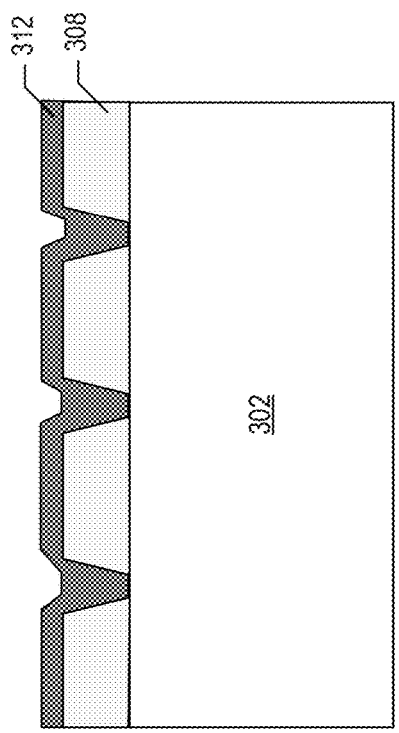
Figure 3E:
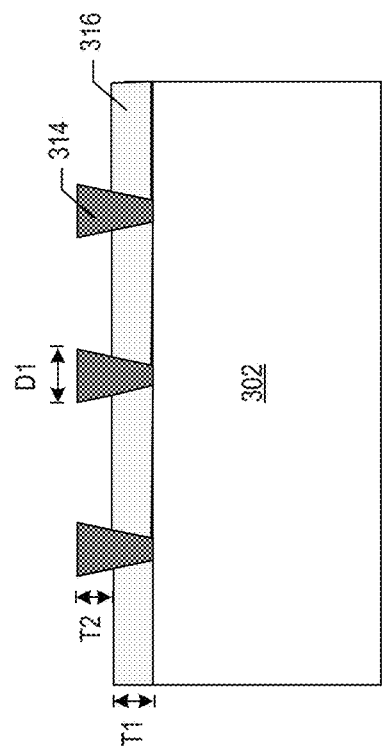
Figure 3E:
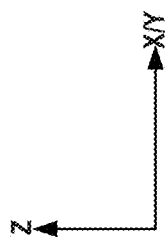
Figure 4B:
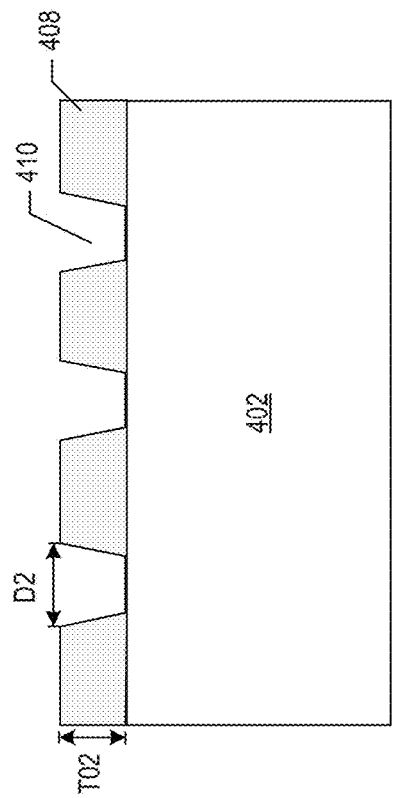
FIGS. 4A-4D illustrate an exemplary fabrication process for forming another semiconductor structure in the semiconductor device in FIG. 2, according to some embodiments.
Figure 4A:
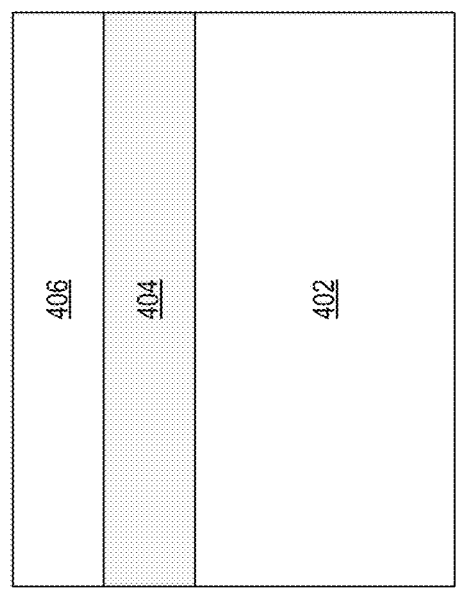
Figure 4D:
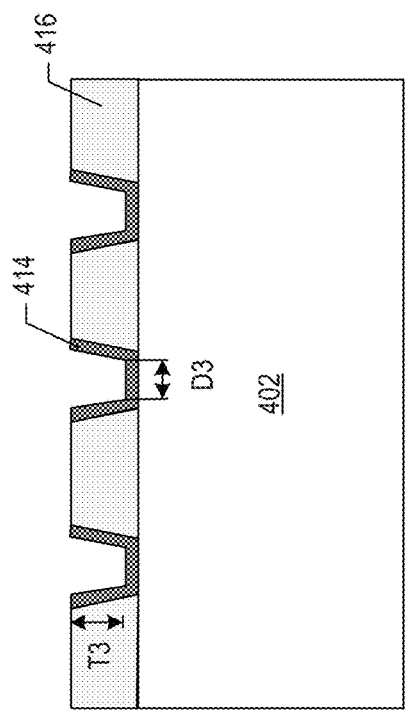
Figure 4D:
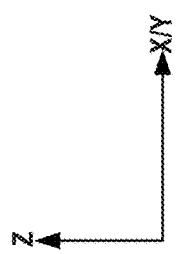
Figure 4C:
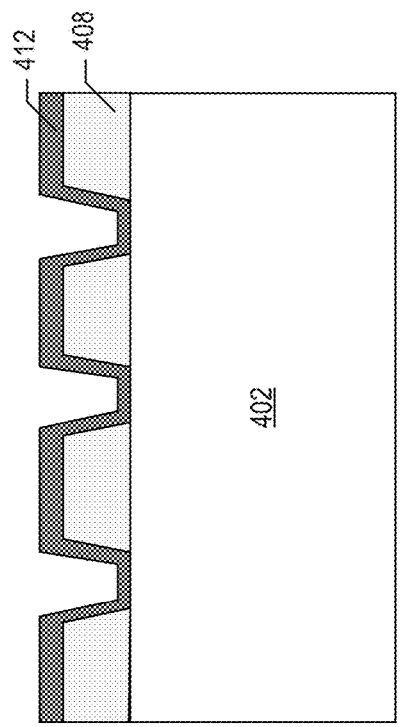
Figure 4C:
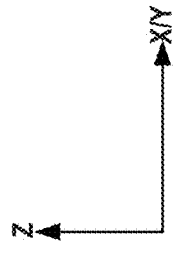
Figure 5A:
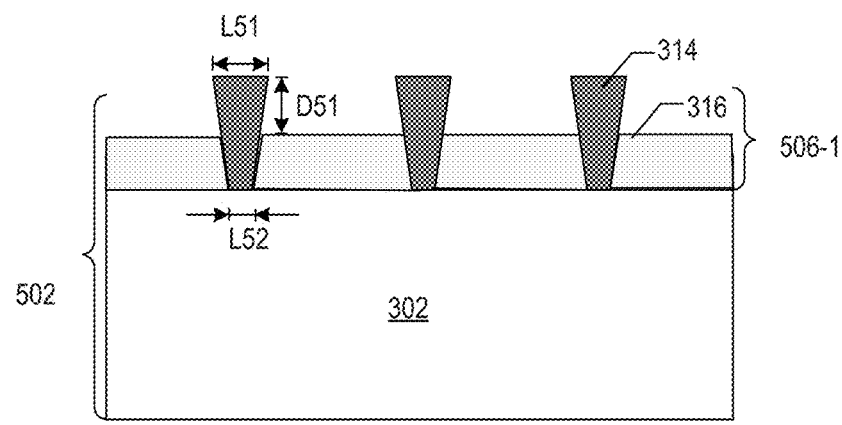
FIGS. 5A-5C illustrate a fabrication process for bonding semiconductor structures for forming an exemplary semiconductor device, according to some embodiments.
Figure 5A:
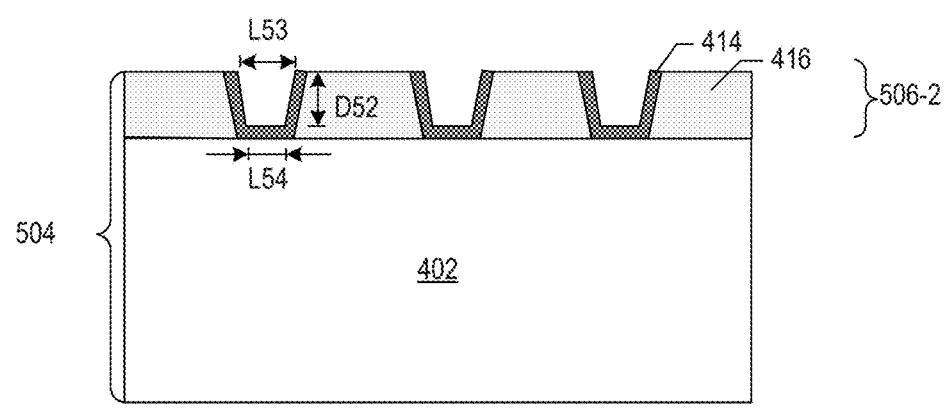
Figure 5A:
Figure 5B:
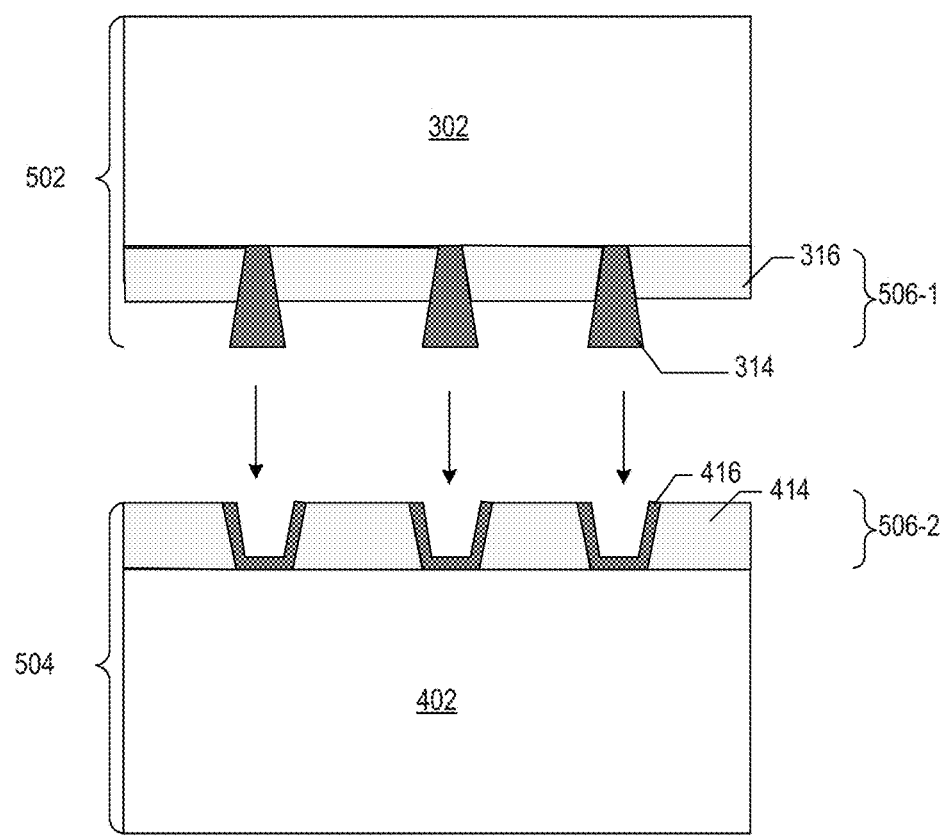
Figure 5C:
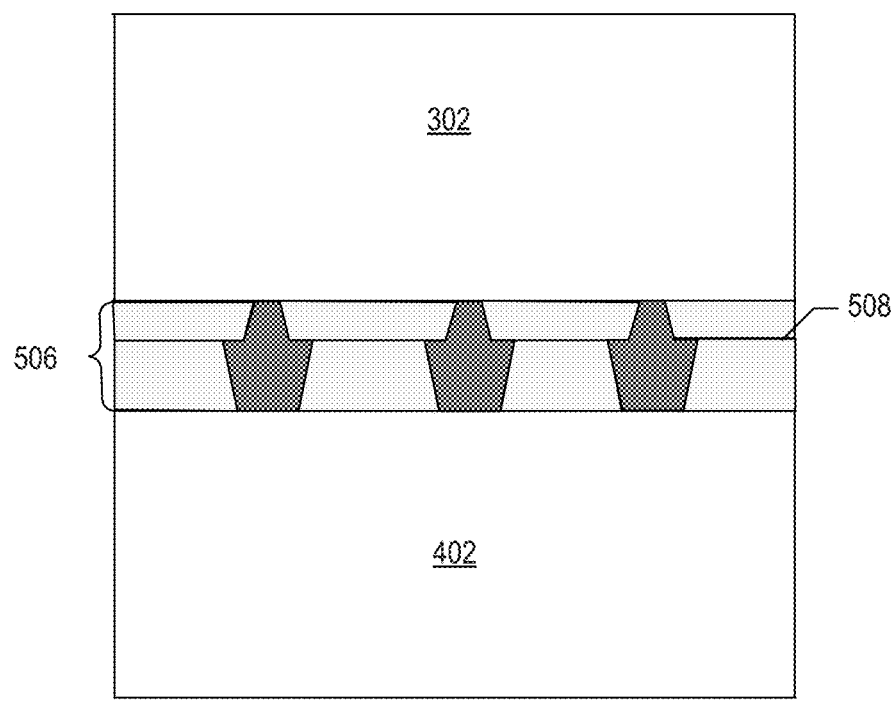
Figure 5C:
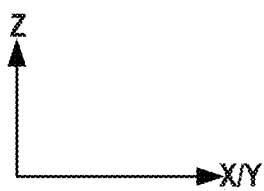
Figure 6A:
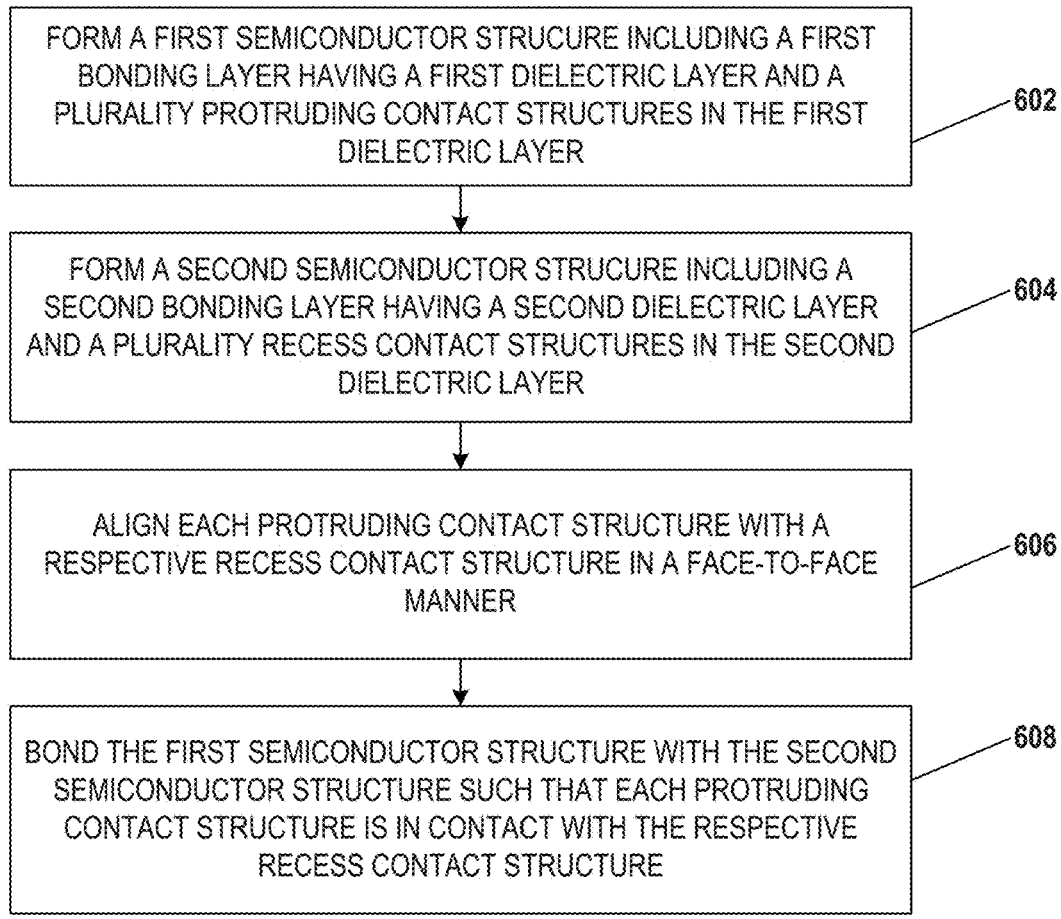
FIGS. 6A and 6B each illustrates a flowchart of an exemplary method for forming a semiconductor device, according to some embodiments.
Figure 6B:
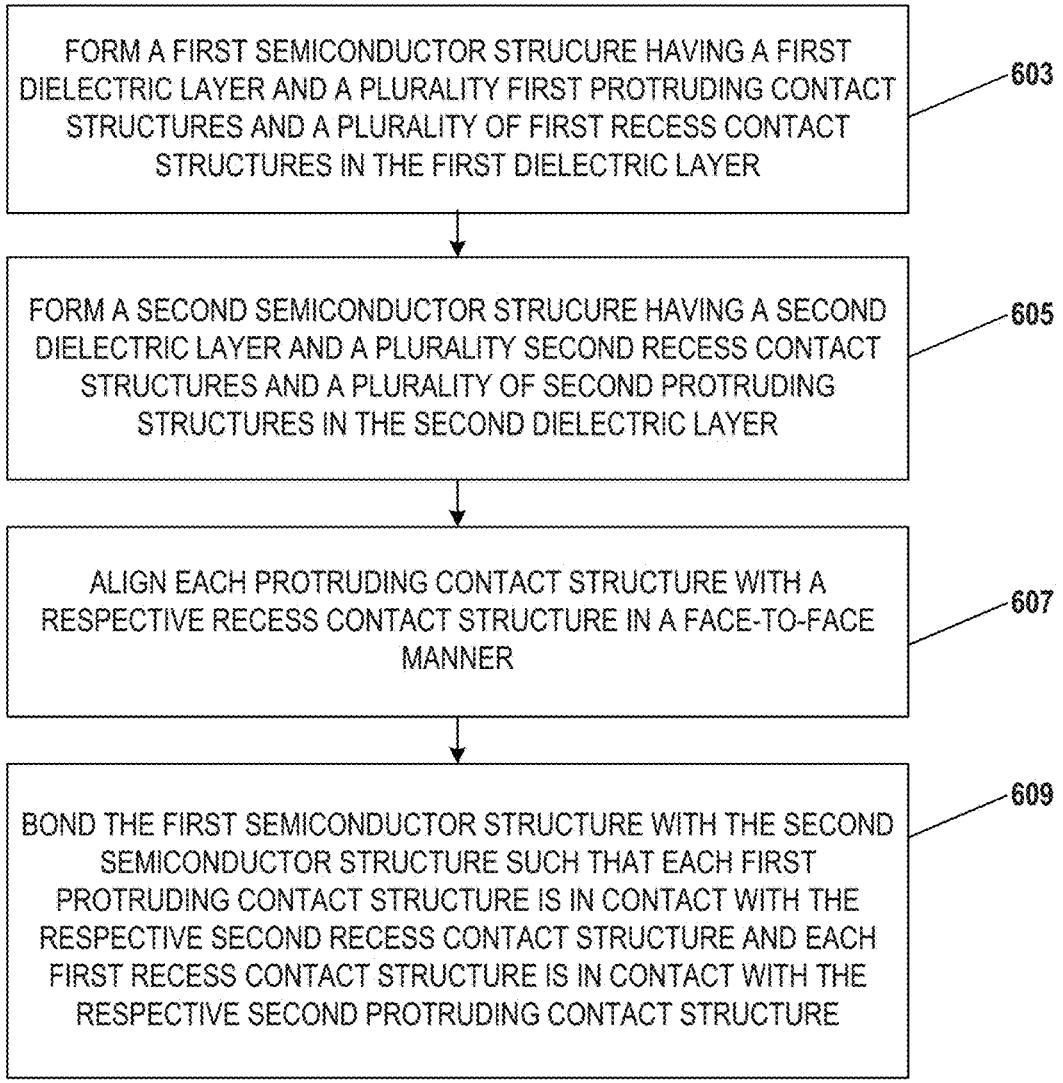
Figure 7A:
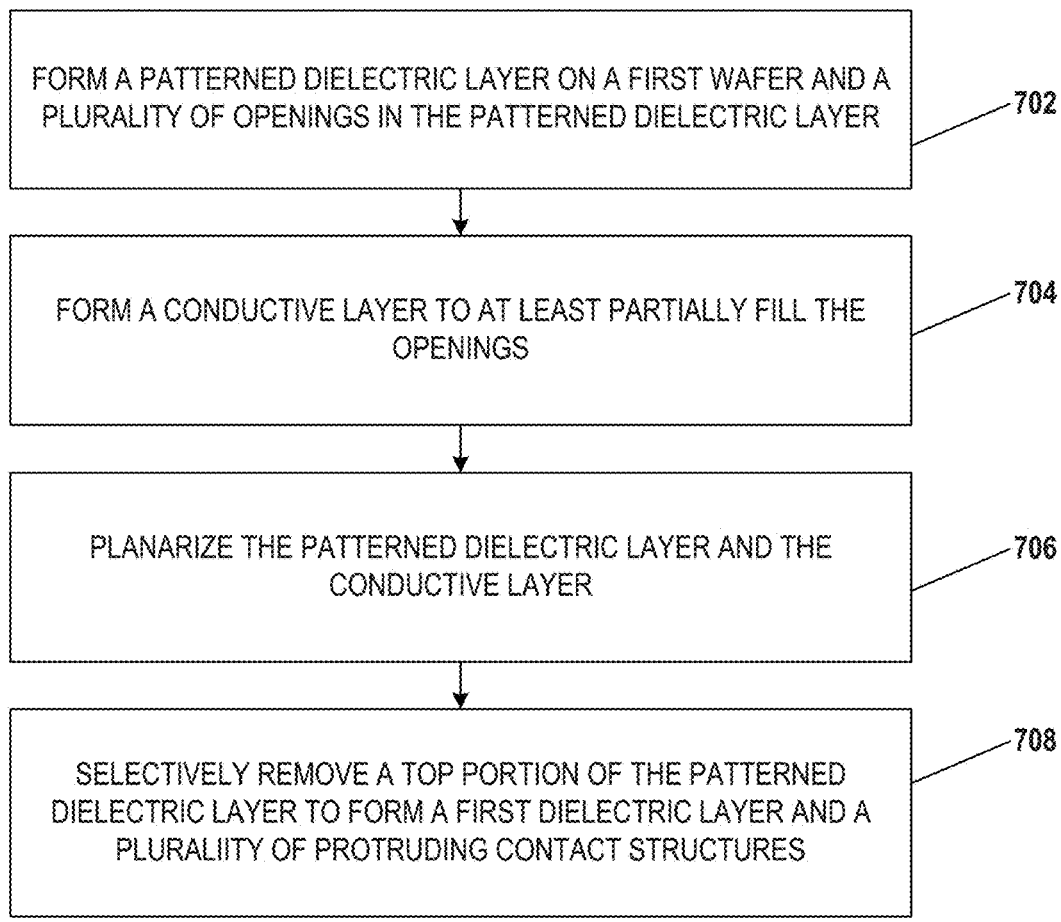
FIGS. 7A and 7B each illustrates a flowchart of an exemplary method for forming a semiconductor structure, according to some embodiments.
Figure 7B:
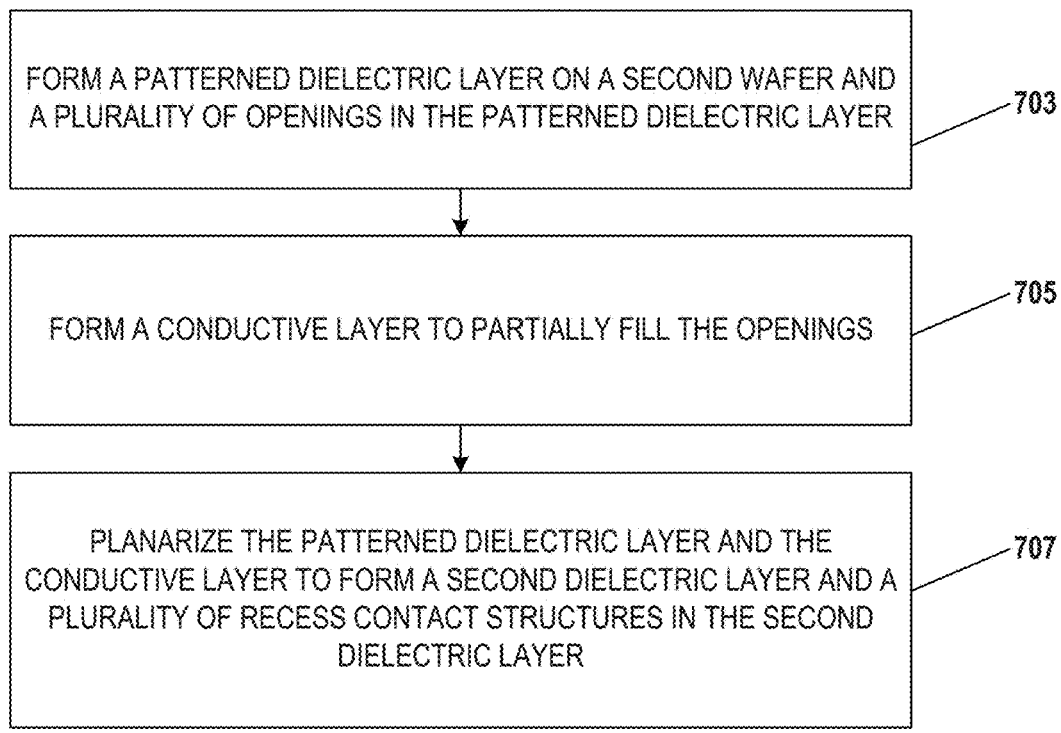

FIGS. 3A-3E illustrate an exemplary method 300 for forming a bonding layer, in a semiconductor structure, having a plurality of protruding contact structures, according to some embodiments. FIG. 7A illustrates a flowchart 700 of the method 300 shown in FIGS. 3A-3E. FIGS. 4A-4D illustrate an exemplary method 400 for forming a bonding layer, in a semiconductor structure, having a plurality of recess contact structures, according to some embodiments. FIG. 7B illustrates a flowchart 701 of method 400 shown in FIGS. 4A-4D. FIGS. 5A-5C illustrate an exemplary bonding method 500 for bonding a pair of semiconductor structures, according to some embodiments. FIG. 6A illustrates a flowchart 600 for bonding method 500 employed on a pair of semiconductor structures, according to some embodiments. FIG. 6B illustrates a flowchart 601 for bonding method 500 employed on another pair of semiconductor structures, according to some embodiments. For ease of description, methods illustrated in FIGS. 3A-3E, 4A-4D, and 5A-5C, are described together. It is understood that the operations shown in methods 300, 400, and 500 are not exhaustive and that other operations can be performed as well before, after, or between any of the illustrated operations. Further, some of the operations may be performed simultaneously, or in a different order than shown in FIGS. 3A-3E, 4A-4D, and 5A-5C. Flowchart 600 may be employed to form a semiconductor device having a bonding structure similar to bonding structure 106 shown in FIG. 1B or 1C.

Referring to FIG. 6A, flowchart 600 starts at operations 602 and 604, in which a first semiconductor structure and a second semiconductor structure are respectively formed. The first semiconductor structure includes a first bonding layer having a first dielectric layer and a plurality of protruding contact structures in the first dielectric layer. The second semiconductor structure includes a second bonding layer having a second dielectric layer and a plurality of recess contact structures in the second dielectric layer. FIG. 5A illustrates a corresponding structure. In various embodiments, operations 602 and 604 may be performed at the same time or at different times.

As shown in FIG. 5A, a first semiconductor structure 502 and a second semiconductor structure 504 are respectively formed. First semiconductor structure 502 may include a first bonding layer 506-1, formed on a first wafer 302, having a first dielectric layer 316 and a plurality of protruding contact structures 314 in first dielectric layer 316. Second semiconductor structure 504 may include a second bonding layer 506-2, formed on a second wafer 402, having a second dielectric layer 416 and a plurality of recess contact structures 414 in second dielectric layer 416. Each protruding contact structure 314 may be bonded to be in contact with a respective recess contact structure 414 in subsequent operations. In some embodiments, the bottom surfaces of protruding contact structures 314 and recess contact structures 414 may each be in contact with and conductively connected to the respective wafer.

As shown in FIG. 5A, the top surface of protruding contact structure 314 may be above the top surface of first dielectric layer 316, and the top surface of recess contact structure 414 may be below the top surface of second dielectric layer 416. In some embodiments, the locations and dimensions (e.g., lateral and vertical dimensions) of each protruding contact structure 314 and the respective recess contact structure 414 allow protruding contact structure 314 to be in contact with the respective recess contact structure 414 vertically and laterally when bonded. In some embodiments, of protruding contact structure 314, a lateral dimension L51 of the top surface may be greater than or equal to a lateral dimension L52 of the bottom surface. In some embodiments, of recess contact structure 414, a lateral dimension L53 of the top opening may be greater than or equal to a lateral dimension L54 of the bottom surface. In some embodiments, lateral dimension L51 may be greater than or equal to lateral dimension L54. Lateral dimension L51 may be greater than, equal to, or less than lateral dimension L53. In some embodiments, lateral dimension L51 is equal to or less than lateral dimension L53. In some embodiments, a distance D51 between the top surface of protruding contact structure 314 and the top surface of first dielectric layer 316 may be greater than or equal to a distance D52 (e.g., a depth of recess contact structure 414) between the top surface of second dielectric layer 416 and the bottom surface of recess contact structure 414.

In some embodiments, lateral dimensions L51 and L52 may each be in the range of about 200 nm to about 350 nm (e.g., 200 nm, 250 nm, 280 nm, 300 nm, 320 nm, 350 nm). In some embodiments, lateral dimensions L53 and L54 may each be in the range of about 300 nm to about 450 nm (e.g., 300 nm, 350 nm, 380 nm, 400 nm, 420 nm, 450 nm). In some embodiments, lateral dimension L52 is less than lateral dimension L53. In some embodiments, along the z-direction, each of first and second dielectric layers 316 and 416 has a thickness in a range of about 150 nm to about 300 nm (e.g., 150 nm, 180 nm, 200 nm, 250 nm, 280 nm, 300 nm, 320 nm, 350 nm). In some embodiments, the thickness of each of first and second dielectric layers 316 and 416 is about 200 nm.

In some embodiments, protruding contact structures 314 and recess contact structures 414 can each include conductive materials including, but not limited to, W, Co, Cu, Al, silicides, or any combination thereof. In some embodiments, protruding contact structures 314 and recess contact structures 414 each include Cu. First and second dielectric layers 316 and 416 may each include, but not limited to, silicon oxide, silicon nitride, silicon oxynitride, low-k dielectrics, or any combination thereof.

As previously described, first and second semiconductor structures 502 and 504 can be formed at the same time or at different times, before the time of bonding. FIGS. 3A-3E illustrate method 300 for forming first semiconductor structure 502, according to some embodiments. FIG. 7A illustrates a flowchart 700 of method 300.

Referring to FIG. 7A, flowchart 700 starts at operation 702, in which a patterned dielectric layer and a plurality of openings in the patterned dielectric layer, are formed on a first wafer. FIGS. 3A and 3B illustrate corresponding structures.

As shown in FIG. 3B, a patterned dielectric layer 308 and a plurality of openings 310 in patterned dielectric layer 308 are formed on a first wafer 302. In some embodiments, a thickness T01 of patterned dielectric layer 308 is greater than 200 nm. In some embodiments, a lateral dimension D1 of opening 310 (e.g., at the surface coplanar with the top surface of patterned dielectric layer 308) is in the range of about 200 nm to about 350 nm (e.g., 200 nm, 250 nm, 280 nm, 300 nm, 320 nm, 350 nm). In some embodiments, D1 is about 300 nm. In various embodiments, first wafer 302 may include a plurality of logic process-compatible devices or an array of NAND memory cells. First wafer 302 may be formed before the formation of patterned dielectric layer 308 and openings 310.

An exemplary process to form first wafer 302 having an array of NAND memory cells is described as follows, according to some embodiments. First wafer 302 may include an array of NAND memory cells and an interconnect layer conductively connected to the array of NAND memory cells. In some embodiments, a memory stack is formed above a substrate, and an array of NAND memory strings extending vertically through the memory stack are formed. First, a plurality of interleaved sacrificial layers and dielectric layers are formed above a substrate (e.g., a silicon substrate). The interleaved sacrificial layers and dielectric layers can form a dielectric stack. In some embodiments, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layered deposition (ALD), or any combination thereof. In some embodiments, a memory stack can be formed by a gate replacement process, e.g., replacing the sacrificial layers with a plurality of conductor layers using wet/dry etch of the sacrificial layers selective to the dielectric layers and filling the resulting recesses with the conductor layers. As a result, the memory stack can include interleaved conductor layers and dielectric layers. In some embodiments, each conductor layer includes a metal layer, such as a layer of tungsten. It is understood that the memory stack may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between the memory stack and the substrate.

3D NAND memory strings may then be formed above the substrate. Each of the memory strings extends vertically through the interleaved conductor layers and the dielectric layers of the memory stack. In some embodiments, the fabrication processes to form a 3D NAND memory string include forming a channel hole through the memory stack into the substrate using dry etching/and or wet etching, such as deep reactive-ion etching (DRIE), followed by epitaxially growing a plug in the lower portion of the channel hole from the substrate. In some embodiments, the fabrication processes to form a 3D NAND memory string also include subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. In some embodiments, the fabrication processes to form a 3D NAND memory string further include forming another plug in the upper portion of the channel hole by etching a recess at the upper end of the 3D NAND memory string, followed by filling the recess with a semiconductor material using thin film deposition processes such as ALD, CVD, PVD, or any combination thereof. In some embodiments, instead of an array of 3D NAND memory cells, an array of 2D NAND memory cells are formed on the substrate. In some embodiments, the 2D NAND memory cells include "floating gate" type of 2D NAND memory cells and/or "charge trap" type of 2D NAND memory cells.

In some embodiments, an interconnect layer is formed above the array of 3D NAND memory cells. The interconnect layer can include a plurality of interconnects in one or more ILD layers. The interconnect layer can include interconnects of MEOL and/or BEOL in a plurality of ILD layers to make electrical connections with the array of 3D NAND memory strings. In some embodiments, the interconnect layer includes multiple ILD layers and interconnects therein formed in multiple processes. For example, the interconnects in the interconnect layer can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated can be collectively referred to as the interconnect layer. In some embodiments, the interconnect layer is formed above the array of 2D NAND memory cells.

An exemplary process to form first wafer 302 having a plurality of logic process-compatible devices is described as follows, according to some embodiments. First wafer 302 may include the logic process-compatible devices and an interconnect layer conductively connected to the logic process-compatible devices. The logic process-compatible devices may include at least a processor, an array of RAM cells, and peripheral circuits. In some embodiments, a plurality of transistors are formed on a substrate (e.g., a silicon substrate). The transistors can be formed by a plurality of processes including, but not limited to, photolithography, dry/wet etch, thin film deposition, thermal growth, implantation, chemical mechanical polishing (CMP), and any other suitable processes. In some embodiments, doped regions are formed in the substrate by ion implantation and/or thermal diffusion, which function, for example, as source regions and/or drain regions of the transistors. In some embodiments, isolation regions (e.g., STIs) are also formed in the substrate by wet/dry etch and thin film deposition. The transistors can form a device layer on the substrate. In some embodiments, the device layer includes a processor, an array of RAM cells, and a peripheral circuit.

An interconnect layer can then be formed above the processor and the array of RAM cells. The interconnect layer can include a plurality of interconnects in one or more ILD layers. The interconnect layer can include interconnects of MEOL and/or BEOL in a plurality of ILD layers to make electrical connections with the device layer. In some embodiments, the interconnect layer includes multiple ILD layers and interconnects therein formed in multiple processes. For example, the interconnects in the interconnect layer can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and the interconnects can be collectively referred to as the interconnect layer.

Referring back to FIG. 3A, after first wafer 302 is formed, a dielectric material layer 304 may be formed over first wafer 302, and a mask layer 306 can be formed over dielectric material layer 304. In some embodiments, dielectric material layer 304 is formed above, e.g., on the top surface of the interconnect layer of first wafer 302. Dielectric material layer 304 can include a suitable dielectric material such as silicon oxide and may be formed by one or more thin film deposition processes including, but not limited to, CVD, PVD, ALD, or any combination thereof. Mask layer 306 may include any suitable soft and/or hard material that can be patterned to form an etch mask for patterning dielectric material layer 304. In some embodiments, mask layer 306 can be a single-layered structure or multiple-layered structure and includes a layer of photoresist. Mask layer 306 may then be patterned, using a photolithography process, to form an etch mask having openings that correspond to the locations and dimensions of openings 310. The openings in the etch mask may expose dielectric material layer 304. A suitable etching process, e.g., dry etch and/or wet etch, can be performed to remove portions of dielectric material layer 304, forming openings 310. In some embodiments, an isotropic etching process, e.g., wet etch, is employed to form openings 310. In some embodiments, the lateral dimension of opening 310 gradually decreases towards first wafer 302. In some embodiments, openings 310 may expose the contacts and/or VIAs in the interconnect layer in first wafer 302. The etch mask may then be removed. Referring back to FIG. 3B, patterned dielectric layer 308, with openings 310 exposing first wafer 302, can be formed.

Referring back to FIG. 7A, flowchart 700 proceeds to operation 704, in which a conductive layer is formed to at least partially fill the openings. FIG. 3C illustrates a corresponding structure.

As shown in FIG. 7A, a conductive layer 312 is formed over patterned dielectric layer 308 and openings 310 to at least partially fill openings 310. In some embodiments, conductive layer 312 fully fills each opening 310. Conductive layer 312 may be formed by any suitable deposition method such as electroplating, CVD, PVD, ALD, or any combination thereof. In some embodiments, conductive layer 312 includes copper and the deposition of conductive layer 312 includes electroplating. In some embodiments, filling openings 310 includes depositing an adhesion (glue) layer, a barrier layer, and/or a seed layer before depositing conductive layer 312.

Referring back to FIG. 7A, flowchart 700 proceeds to operation 706, in which the patterned dielectric layer and the conductive layer are planarized. FIG. 3D illustrates a corresponding structure.

As shown in FIG. 3D, conductive layer 312 and patterned dielectric layer 308 can be planarized to form a plurality of protruding contact structures 314 in patterned dielectric layer 308. Protruding contact structures 314 may be in contact with and conductively connected to the exposed contacts and VIAs in the interconnect layer in first wafer 302. The planarization process may include any suitable methods such as chemical mechanical polishing (CMP) and/or recess etch. Depending on the thickness of conductive layer 312, the planarization process may or may not remove a top portion of patterned dielectric layer 308. The top surfaces of protruding contact structures 314 may be coplanar with the top surface of patterned dielectric layer 308, after the planarization process.

Referring back to FIG. 7A, flowchart 700 proceeds to operation 708, in which a top portion of the patterned dielectric layer is selectively removed to form a first dielectric layer and a plurality of protruding contact structures in the first dielectric layer. FIG. 3E illustrates a corresponding structure.

As shown in FIG. 3E, a top portion of patterned dielectric layer 308 may be removed to expose a sidewall of each protruding contact structures 314, forming a first dielectric layer 316. Protruding contact structures 314 and first dielectric layer 316 may form first bonding layer 506-1. A thickness T2 of the removed portion of patterned dielectric layer 308 may allow a sufficient portion of protruding contact structure 314 to be bonded with a respective recess contact structure. In some embodiments, a thickness T1 of first dielectric layer may be about 200 nm. In some embodiments, a selective etching process can be performed to remove the top portion of patterned dielectric layer 308 and retain protruding contact structure 314. The selective etching process may have a higher etch rate on patterned dielectric layer 308 than protruding contact structure 314. In some embodiments, the selective etching process includes a suitable wet etch. The lateral dimension of the top surface of protruding contact structure 314 may be equal to D1 (i.e., equal to L51). First bonding layer 506-1, having first dielectric layer 316 and protruding contact structures 314, may be formed FIGS. 4A-4D illustrate method 400 for forming second semiconductor structure 504, according to some embodiments. FIG. 7B illustrates a flowchart 701 of method 400.

Referring to FIG. 7B, flowchart 701 starts at operation 703, in which a patterned dielectric layer and a plurality of openings in the patterned dielectric layer, are formed on a second wafer. FIGS. 4A and 4B illustrate corresponding structures.

As shown in FIG. 4B, a patterned dielectric layer 408, and a plurality of openings 410 in patterned dielectric layer 408, are formed on a second wafer 402. In some embodiments, a thickness T02 of patterned dielectric layer 408 is equal to or greater than 200 nm. In some embodiments, a lateral dimension D2 of opening 410 (e.g., at the surface coplanar with the top surface of patterned dielectric layer 408) is in the range of about 300 nm to about 450 nm (e.g., 300 nm, 350 nm, 380 nm, 400 nm, 420 nm, 450 nm). In some embodiments, D2 is about 400 nm.

Second wafer 402 may be a different wafer from first wafer 302. For example, if first wafer 302 includes a plurality of logic process-compatible devices, second wafer 402 may include an array of NAND memory cells, and vice versa. It should be noted that, in various embodiments, when more than two semiconductor structures are bonded together, second wafer 402 may also be the same as first wafer 302 or may include other components, depending on the design of the semiconductor device. The actual components and functions of the first and second semiconductor structures should not be limited by the embodiments of the present disclosure. Second wafer 402 may be formed before the formation of patterned dielectric layer 408 and openings 410. The detailed description of the formation of second wafer 402 can be referred to as the formation of first wafer 302, e.g., include 3D NAND memory cells or logic process-compatible devices, and is not repeated herein.

The formation of patterned dielectric layer 408 and openings 410 may be similar to those of patterned dielectric layer 308 and openings 310. As shown in FIG. 4A, a dielectric material layer 404 may be formed over second wafer 402, and a mask layer 406 may be formed over dielectric material layer 404. Mask layer 406 may then be patterned, for the patterning of dielectric material layer 404. The materials of mask layer 406 and dielectric layer 404, and the fabrication processes performed to form patterned dielectric layer 408 and openings 410 may be similar to the operations described in FIGS. 3A and 3B, and the detailed description is not repeated herein.

Referring back to FIG. 7B, flowchart 701 proceeds to operation 705, in which a conductive layer is formed to partially fill the openings. FIG. 4C illustrates a corresponding structure.

As shown in FIG. 4C, a conductive layer 412 is formed over patterned dielectric layer 408 and openings 410 to partially fill openings 410. The material and deposition process of conductive layer 412 may be similar to those of conductive layer 312, and the detailed description is not repeated herein. However, different from conductive layer 312, conductive layer 412 partially fills each opening 410 such that a top surface of conductive layer 412 in openings 410 may be below the top surface of patterned dielectric layer 408.

Referring back to FIG. 7B, flowchart 701 proceeds to operation 707, in which the conductive layer and the patterned dielectric layer are planarized to form a second dielectric layer and a plurality of recess contact structures in the second dielectric layer. FIG. 4D illustrates a corresponding structure.

As shown in FIG. 4D, conductive layer 412 and patterned dielectric layer 408 can be planarized to form a plurality of recess contact structures 414 in a second dielectric layer 416. In some embodiments, recess contact structure 414 may cover, partially or fully, the bottom surface and the side surfaces of the respective opening 410. Recess contact structures 414 may be in contact with and conductively connected to the exposed contacts and VIAs in the interconnect layer in second wafer 402. The planarization process may include any suitable methods such as CMP and/or recess etch. Depending on the thickness of conductive layer 412, the planarization process may or may not remove the top portion of patterned dielectric layer 408. The top surfaces of recess contact structures 414 may be coplanar with the top surface of second dielectric layer 416, after the planarization process. Second bonding layer 506-2, having second dielectric layer 416 and recess contact structures 414, may be formed.

A depth T3 of recess contact structure 414 may be the distance between the top surface of second dielectric layer 416 and the bottom surface of recess contact structure 414, as shown in FIG. 4D. A lateral dimension D3 (e.g., equal to L54) represents the lateral dimension (e.g., width/diameter) of the bottom surface of recess contact structure 414. In some embodiments, depth T3 of recess contact structure 414 is equal to or greater than thickness T2 of the portion of protruding contact structure 314 above first dielectric layer 316, and the lateral dimension D3 of recess contact structure 414 is less than or equal to lateral dimension D1 of protruding contact structure 314.

Referring back to FIG. 6A, flowchart 600 proceeds to operation 606, in which each protruding contact structure is aligned with a respective recess contact structure in a face-to-face manner FIG. 5B illustrates a corresponding structure.

As shown in FIG. 5B, one of first and second semiconductor structures 502 and 504 is flipped over such that each protruding contact structure 314 is aligned with a respective (e.g., matching) recess contact structure 414 in a face-to-face manner along the z-direction. As an example, first semiconductor structure 502 is flipped to be aligned with second semiconductor structure 504.

Referring back to FIG. 6A, flowchart 600 proceeds to operation 608, in which the first and second semiconductor structures are bonded such that each protruding contact structure is in contact with a respective recess contact structure. FIG. 5C illustrates a corresponding structure.

As shown in FIG. 5C, first and second semiconductor structures 502 and 504 are bonded together such that that first and second bonding layers 506-1 and 506-2 are bonded with each other. Each protruding contact structure 314 may be in contact with a respective recess contact structure 414, and first dielectric layer 316 may be in contact with second dielectric layer 416. A bonding interface 508 is formed between first and second bonding layers 506-1 and 506-2. The bonded first and second bonding layers 506-1 and 506-2 may form a bonding structure 506.

The bonding process may include hybrid bonding, in which suitable thermal compression can be used, if necessary. Compared to conventional flat-surface hybrid bonding, the shapes and dimensions of bonding layers 506-1 and 506-2 may facilitate higher bonding strength because of contact between protruding contact structure 314 and respective recess contact structure 414 along lateral directions. During the bonding process, at least one of protruding contact structure 314 and recess contact structure 414 may undergo deformation, generating heat in the contact area (e.g., side surfaces) between protruding contact structure 314 and recess contact structure 414. For example, because of the shapes and dimensions of protruding contact structure 314 and the respective recess contact structure 414 as previously described, friction can occur along the side surfaces of protruding contact structure 314 and the respective recess contact structure 414 during the bonding process, altering atom arrangement in the side surfaces. Mechanical energy generated as a result of the deformation may be converted to heat, which increases the diffusion of atoms between side surfaces. Also, the deformation can create more vacant boundaries, make it easier for atoms that absorbed thermal energy from the friction to diffuse between side surfaces. The diffusion can thus improve the bonding strength between protruding contact structure 314 and the respective recess contact structure 414. Thus, even at low temperature, the hybrid bonding of the present disclosure can provide improved bonding strength.

FIG. 6B illustrates another flowchart 601 of method 500, according to some embodiments. Different from the operations shown in flowchart 600, flowchart 601 includes operations employed to form and bond semiconductor structures each having protruding contact structures and recess contact structures. The formed semiconductor device may have a bonding structure similar to bonding structure 106 shown in FIG. 1D.

Referring to FIG. 6B, flowchart 601 starts at operation 603, in which a first semiconductor structure having a first dielectric layer, and a plurality of first protruding contact structures and a plurality of first recess contact structures in the first dielectric layer are formed. The first protruding contact structures and first recess contact structures may be formed separately, e.g., using separate fabrication processes. In some embodiments, some structures in the first protruding contact structures and the first recess contact structures can be formed in the same fabrication processes. For example, the patterned dielectric layers and conductive layers in first protruding contact structures and the first recess contact structures may be formed by the same fabrication processes. The fabrication processes to form the first semiconductor structure may be referred to as the fabrication processes that form protruding contact structure 314 and recess contact structure 414 illustrated in FIGS. 3A-3E and FIGS. 4A-4D, and the detailed description is not repeated herein.

Flowchart 601 proceeds to operation 605, in which a second semiconductor structure having a second dielectric layer, and a plurality of second protruding contact structures and a plurality of second recess contact structures in the second dielectric layer are formed. The second semiconductor structure may be formed by the same fabrication processes that form the first semiconductor structure or may be formed by different fabrication processes. In various embodiments, operations 603 and 605 may be performed at the same time or at different times. The fabrication processes to form the second semiconductor structure may be referred to as the fabrication processes that form protruding contact structure 314 and recess contact structure 414 illustrated in FIGS. 3A-3E and FIGS. 4A-4D, and the detailed description is not repeated herein.

Flowchart 601 proceeds to operation 607, in which each protruding contact structure is aligned with a respective recess contact structure in a face-to-face manner Specifically, each first protruding contact structure is aligned with a respective (e.g., matching) second recess contact structure, and each first recess contact structure is aligned with a respective (e.g., matching) second protruding contact structure.

Flowchart 601 proceeds to operation 609, in which the first semiconductor structure is bonded, using hybrid bonding, with the second semiconductor structure such that each first protruding contact structure is in contact with a respective second recess contact structure, and each first recess contact structure is in contact with a respective second protruding contact structure.

It should be noted that, although, in the present disclosure, a 3D memory device and its formation process is employed as an example to explain the bonding structures and methods for forming the bonding structures, the disclosed bonding structures and methods for forming the bonding structures can be used in any suitable devices and/or scenarios where bonding structures, e.g., with improved bonding strength, are used for forming bonding between two structures.

In some embodiments, after the bonded semiconductor structures are formed, the substrate of first semiconductor structure (e.g., the semiconductor above the bonding layer) may be thinned so that the thinned top substrate can serve as a semiconductor layer, for example, a single-crystal silicon layer or a polysilicon layer. The substrate can be thinned by processes including, but not limited to, wafer grinding, dry etch, wet etch, CMP, any other suitable processes, or any combination thereof. A pad-out interconnect layer is formed above the semiconductor layer. The pad-out interconnect layer can include interconnects, such as pad contacts, formed in one or more ILD layers. The pad contacts can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

Embodiments of the present disclosure provide a method for forming a semiconductor device. The method includes the following operations. In a first semiconductor structure, a first bonding layer is formed having a first dielectric layer and a plurality of protruding contact structures. In a second semiconductor structure, a second bonding layer is formed having a second dielectric layer and a plurality of recess contact structures. The plurality of protruding contact structures are bonded with the plurality of recess contact structures such that each of the plurality of protruding contacts is in contact with a respective recess contact structure.

In some embodiments, each of the plurality of protruding contact structures is in contact with the respective recess contact structure such that a top surface of each of the plurality of protruding contact structure is in contact with a bottom surface of the respective recess contact structure and a side surface of each of the plurality of protruding contact structure is in contact with a side surface of the respective recess contact structure.

In some embodiments, the first dielectric layer is in contact with the second dielectric layer, and the bonding of the plurality of protruding contact structures with the plurality of recess contact structures includes a hybrid bonding process.

In some embodiments, forming the first dielectric layer and the plurality of protruding contact structures include forming the first dielectric layer over a first wafer and forming the plurality of protruding contact structures in the first dielectric layer, A top surface of each of the plurality of protruding contact structure is above a top surface of the first dielectric layer.

In some embodiments, forming the first dielectric layer and the plurality of protruding contact structures include forming a patterned dielectric layer on the first wafer and a plurality of openings in the patterned dielectric layer, forming a conductive layer to at least partially fill the openings, and planarizing top surfaces of the patterned dielectric layer and the conductive layer. Forming the first dielectric layer and the plurality of protruding contact structures may also include selectively removing a top portion of the planarized patterned dielectric layer to form the first dielectric layer and the plurality of protruding contact structures.

In some embodiments, forming the conductive layer includes performing at least one of electroplating, CVD, PVD, or ALD.

In some embodiments, a top surface of the planarized conductive layer is coplanar with a top surface of the planarized patterned dielectric layer, and planarizing the top surfaces of the patterned dielectric layer and the conductive layer include performing at least one of a chemical mechanical polishing or a recess etch on the top surfaces of the patterned dielectric layer and the conductive layer.

In some embodiments, the method further includes retaining the planarized conductive layer when the top portion of the planarized patterned dielectric layer is removed.

In some embodiments, forming the second dielectric layer and the plurality of recess contact structures include forming the second dielectric layer over a second wafer and forming the plurality of recess contact structures in the second dielectric layer. A top surface of each of the plurality of recess contact structure is below a top surface of the second dielectric layer.

In some embodiments, forming the second dielectric layer and the plurality of recess contact structures include forming another patterned dielectric layer on the second wafer and a plurality of other openings in the other patterned dielectric layer, forming another conductive layer to partially fill the other openings, and planarizing top surfaces of the other patterned dielectric layer and the other conductive layer.

In some embodiments, forming the other conductive layer includes performing at least one of electroplating, CVD, PVD, or ALD.

In some embodiments, planarizing the top surfaces of the other patterned dielectric layer and the other conductive layer includes performing at least one of a chemical mechanical polishing or a recess etch on the top surfaces of the other patterned dielectric layer and the other conductive layer.

In some embodiments, partially filling the other openings includes forming the other conductive layer to cover a bottom surface and a side surface of each of the other openings, such that a top surface of the other conductive layer is below the top surface of the other patterned dielectric layer.

In some embodiments, a top lateral dimension of each of the other openings is greater than a top lateral dimension of a respective opening.

In some embodiments, a lateral dimension of the top surface of each of the protruding contact structures is greater than or equal to a lateral dimension of the bottom surface of the respective recess contact structure.

In some embodiments, a distance between the top surface of each of the protruding contact structures and a top surface of the first dielectric layer is greater than or equal to a thickness of the second dielectric layer.

In some embodiments, the method includes, in one of the first and second semiconductor structures, forming a plurality of logic process-compatible devices conductively connected to respective bonding layer. The method may also include, in another one of the first and second semiconductor structures, forming an array of NAND memory cells conductively connected to the respective bonding layer.

In some embodiments, the array of NAND memory cells are formed in the first wafer, and the plurality of logic process-compatible devices are formed in the second wafer.

Embodiments of the present disclosure include a method for forming a semiconductor device. The method includes the following operations. In a first semiconductor structure, a first bonding layer is formed having a first dielectric layer, a plurality of first protruding contact structures, and a plurality of first recess contact structures. In a second semiconductor structure, a second bonding layer is formed having a second dielectric layer, a plurality of second recess contact structures, and a plurality of second protruding contact structures. The plurality of first protruding contact structures are bonded with the plurality of second recess contact structures, and the plurality of first recess contact structures are bonded with the plurality of second protruding contact structures. Each of the plurality of first protruding contacts is in contact with a respective second recess contact structure and each of the plurality of first recess contact structures is in contact with a respective second protruding contact structure.

In some embodiments, each of the plurality of first protruding contact structures is in contact with the respective second recess contact structure such that a top surface of each of the plurality of first protruding contact structure is in contact with a bottom surface of the respective second recess contact structure; and a side surface of each of the plurality of first protruding contact structure is in contact with a side surface of the respective second recess contact structure.

In some embodiments, each of the plurality of first recess contact structures is in contact with the respective second protruding contact structure such that a top surface of each of the plurality of second protruding contact structure is in contact with a bottom surface of the respective first recess contact structure; and a side surface of each of the plurality of second protruding contact structure is in contact with a side surface of the respective first recess contact structure.

In some embodiments, the first dielectric layer is in contact with the second dielectric layer; and the bonding of the plurality of first protruding contact structures with the plurality of second recess contact structures and the plurality of first recess contact structures with the plurality of second protruding contact structures include a hybrid bonding process.

In some embodiments, forming the first dielectric layer, the plurality of first protruding contact structures, and the plurality of first recess contact structures include forming the first dielectric layer over a first wafer and forming the plurality of first protruding contact structures and first recess contact structures in the first dielectric layer.

In some embodiments, a top surface of each of the plurality of first protruding contact structure is above a top surface of the first dielectric layer, and a top surface of each of the plurality of first recess contact structure is below the top surface of the first dielectric layer.

In some embodiments, forming the second dielectric layer, the plurality of second recess contact structures, and the plurality of second protruding contact structures include forming the second dielectric layer over a first wafer and forming the plurality of second recess contact structures and second protruding contact structures in the second dielectric layer.

In some embodiments, a top surface of each of the plurality of second recess contact structure is below a top surface of the second dielectric layer, and a top surface of each of the plurality of second protruding contact structure is above the top surface of the second dielectric layer.

Embodiments of the present disclosure provide a semiconductor device having a first semiconductor structure and a second semiconductor structure. The first semiconductor structure includes a first bonding layer having a first dielectric layer and a first portion of a contact structure in the first dielectric layer. The second semiconductor structure includes a second bonding layer having a second dielectric layer and a second portion of the contact structure in the second dielectric layer. The semiconductor device also includes a bonding interface between the first semiconductor structure and the second semiconductor structure. The first and second portions of the contact structure are in contact with each other. A first portion of the bonding interface extends outside the contact structure and between the first and second dielectric layers. A second portion of the bonding interface extends inside the contact structure and is non-coplanar with the first portion of the bonding interface.

In some embodiments, the second portion of the bonding interface extends in at least one of the first portion or the second portion of the contact structure.

In some embodiments, a lateral dimension of a top surface of the contact structure is different from a lateral dimension of a bottom surface of the contact structure.

In some embodiments, one of the lateral dimensions of the top and bottom surfaces of the contact structure is in a range of about 200 nm to about 350 nm. In some embodiments, the other one of the lateral dimensions of the top and bottom surfaces of the contact structure is in a range of about 300 nm to about 450 nm.

In some embodiments, the first and second dielectric layers each has a thickness in a range of about 150 nm to about 300 nm.

In some embodiments, the contact structure includes at least one of copper, tungsten, aluminum, cobalt, polysilicon, or silicides.

In some embodiments, the contact structure includes copper.

In some embodiments, the first semiconductor structure includes a plurality of logic process-compatible devices conductively connected to the contact structure, and the second semiconductor structure includes an array of NAND memory cells conductively connected to the contact structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:
   forming, in a first semiconductor structure, a first bonding layer comprising a first dielectric layer and a plurality of protruding contact structures, wherein forming the first dielectric layer and the plurality of protruding contact structures comprises selectively removing a top portion of the first dielectric layer;
   forming, in a second semiconductor structure, a second bonding layer comprising a second dielectric layer and a plurality of recess contact structures; and
   bonding the plurality of protruding contact structures with the plurality of recess contact structures such that each of the plurality of protruding contacts is in contact with a respective recess contact structure.

2. The method of claim 1, wherein each of the plurality of protruding contact structures is in contact with the respective recess contact structure such that:
   a top surface of each of the plurality of protruding contact structure is in contact with a bottom surface of the respective recess contact structure; and
   a side surface of each of the plurality of protruding contact structure is in contact with a side surface of the respective recess contact structure.

3. The method of claim 1, wherein
   the first dielectric layer is in contact with the second dielectric layer; and
   the bonding of the plurality of protruding contact structures with the plurality of recess contact structures comprises a hybrid bonding process.

4. The method of claim 1, wherein forming the first dielectric layer and the plurality of protruding contact structures comprise:
   forming the first dielectric layer over a first wafer; and
   forming the plurality of protruding contact structures in the first dielectric layer, wherein a top surface of each of the plurality of protruding contact structure is above a top surface of the first dielectric layer.

5. The method of claim 4, wherein forming the first dielectric layer and the plurality of protruding contact structures comprise:
   forming a patterned dielectric layer on the first wafer and a plurality of openings in the patterned dielectric layer;
   forming a conductive layer to at least partially fill the openings; and
   planarizing top surfaces of the patterned dielectric layer and the conductive layer.

6. The method of claim 5, wherein forming the conductive layer comprises performing at least one of electroplating, chemical vapor deposition (CVD), physical vapor deposition (PVD), or atomic layer deposition (ALD).

7. The method of claim 5, wherein a top surface of the planarized conductive layer is coplanar with a top surface of the planarized patterned dielectric layer, and planarizing the top surfaces of the patterned dielectric layer and the conductive layer comprise
   performing at least one of a chemical mechanical polishing or a recess etch on the top surfaces of the patterned dielectric layer and the conductive layer.

8. The method of claim 5, further comprising retaining the planarized conductive layer when the top portion of the planarized patterned dielectric layer is removed.

9. The method of claim 1, wherein forming the second dielectric layer and the plurality of recess contact structures comprise:
   forming the second dielectric layer over a second wafer; and
   forming the plurality of recess contact structures in the second dielectric layer, wherein a top surface of each of the plurality of recess contact structure is below a top surface of the second dielectric layer.

10. The method of claim 9, wherein forming the second dielectric layer and the plurality of recess contact structures comprise:
    forming another patterned dielectric layer on the second wafer and a plurality of other openings in the other patterned dielectric layer;
    forming another conductive layer to partially fill the other openings; and
    planarizing top surfaces of the other patterned dielectric layer and the other conductive layer.

11. The method of claim 10, wherein partially filling the other openings comprises forming the other conductive layer to cover a bottom surface and a side surface of each of the other openings, such that a top surface of the other conductive layer is below the top surface of the other patterned dielectric layer.

12. The method of claim 1, comprising:
    in one of the first and second semiconductor structures, forming a plurality of logic process-compatible devices conductively connected to respective bonding layer; and
    in another one of the first and second semiconductor structures, forming an array of NAND memory cells conductively connected to the respective bonding layer.

13. A method for forming a semiconductor device, comprising:
    forming, in a first semiconductor structure, a first bonding layer comprising a first dielectric layer, a plurality of first conductive protruding contact structures, and a plurality of first conductive recess contact structures;
    forming, in a second semiconductor structure, a second bonding layer comprising a second dielectric layer, a plurality of second conductive recess contact structures, and a plurality of second conductive protruding contact structures; and
    bonding (i) the plurality of first conductive protruding contact structures with the plurality of second conductive recess contact structures, and (ii) the plurality of first conductive recess contact structures with the plurality of second conductive protruding contact structures such that each of the plurality of first conductive protruding contacts is in contact with a respective second conductive recess contact structure and each of the plurality of first conductive recess contact structures is in contact with a respective second conductive protruding contact structure.

14. The method of claim 13, wherein each of the plurality of first conductive protruding contact structures is in contact with the respective second conductive recess contact structure such that:
    a top surface of each of the plurality of first conductive protruding contact structure is in contact with a bottom surface of the respective second conductive recess contact structure; and a side surface of each of the plurality of first conductive protruding contact structure is in contact with a side surface of the respective second conductive recess contact structure.

15. The method of claim 13, wherein each of the plurality of first conductive recess contact structures is in contact with the respective second conductive protruding contact structure such that:
a top surface of each of the plurality of second conductive protruding contact structure is in contact with a bottom surface of the respective first conductive recess contact structure; and
a side surface of each of the plurality of second conductive protruding contact structure is in contact with a side surface of the respective first conductive recess contact structure.

16. A semiconductor device, comprising:
a first semiconductor structure comprising a first bonding layer comprising a first dielectric layer and a first portion of a contact structure in the first dielectric layer;
a second semiconductor structure comprising a second bonding layer comprising a second dielectric layer and a second portion of the contact structure in the second dielectric layer; and
a bonding interface between the first semiconductor structure and the second semiconductor structure, wherein
the first and second portions of the contact structure are in contact with each other;
a first portion of the bonding interface extends outside the contact structure and between the first and second dielectric layers;
a second portion of the bonding interface extends inside the contact structure and is non-coplanar with the first portion of the bonding interface; and
a lateral dimension of a top surface of the contact structure is different from a lateral dimension of a bottom surface of the contact structure, one of the lateral dimensions of the top and bottom surfaces of the contact structure being in a range of about 200 nm to about 350 nm.

17. The semiconductor device of claim 16, wherein the second portion of the bonding interface extends in at least one of the first portion or the second portion of the contact structure.

18. The semiconductor device of claim 16, wherein the other one of the lateral dimensions of the top and bottom surfaces of the contact structure is in a range of about 300 nm to about 450 nm.

19. The semiconductor device of claim 16, wherein the contact structure comprises at least one of copper, tungsten, aluminum, cobalt, polysilicon, or silicides.

20. The semiconductor device of claim 16, wherein
the first semiconductor structure comprises a plurality of logic process-compatible devices conductively connected to the contact structure; and
the second semiconductor structure comprises an array of NAND memory cells conductively connected to the contact structure.

* * * * *